US005521839A

United States Patent [19]
Doolittle et al.

[11] Patent Number: 5,521,839
[45] Date of Patent: May 28, 1996

[54] DEEP LEVEL TRANSIENT SPECTROSCOPY (DLTS) SYSTEM AND METHOD

[75] Inventors: William A. Doolittle, Stockbridge; Ajeet Rohatgi, Marietta, both of Ga.

[73] Assignee: Georgia Tech Research Corporation, Atlanta, Ga.

[21] Appl. No.: 116,111

[22] Filed: Sep. 2, 1993

[51] Int. Cl.$^6$ .................................................. G01N 27/02
[52] U.S. Cl. ...................... 364/499; 364/482; 324/158.1; 324/322
[58] Field of Search .................................. 364/481, 486, 364/482, 498, 499; 324/158 R, 158 D, 322

[56] References Cited

U.S. PATENT DOCUMENTS

| | | | |
|---|---|---|---|
| 3,605,015 | 9/1971 | Copeland, III | 324/158 |
| 3,859,595 | 1/1975 | Lang | 324/158 |
| 3,943,442 | 3/1976 | Fletcher et al. | 324/158 |
| 4,208,624 | 6/1980 | Miller | 324/60 |
| 4,437,060 | 3/1984 | Ferenczi et al. | 324/158 |
| 4,563,642 | 1/1986 | Munakata et al. | 324/158 D |
| 4,571,541 | 2/1986 | Ferenczi et al. | 324/158 |
| 4,704,576 | 11/1987 | Tributsch et al. | 324/158 R |
| 4,839,588 | 6/1989 | Jantsch et al. | 324/158 R |
| 5,047,713 | 9/1991 | Kirino et al. | 324/158 R |
| 5,130,643 | 7/1992 | Foell et al. | 324/158 R |

OTHER PUBLICATIONS

Doolittle et al., "A novel computer based pseudo-logarithmic capacitance/conductance DLTS system specifically designed for transient analysis," Review of Scientific Instruments, vol. 63, No. 12, Dec. 1992, pp. 5733–5741.

Rohtagi, "Application of DLTS Technique for Study of Junctions and Interfaces," Vacuum–Surfaces–Thin Films, pp. 115–133, Dec. 1979.

Morimoto et al., "Multi–Exponential Analysis of DLTS by Contin," pp. 343–348.

D. W. Lang, "Deep–Level Transient Spectroscopy: A New Method . . . ", Jrnl. of Applied Physics, vol. 45, No. 7 Jul., 1974.

Braunlich, "Thermally Stimulated Relaxation in Solids" Springer–Verlag Berlin Heidelberg New York 1979, pp. 93–133.

Benedek et al. "Point and Extended Defects in Semiconductors" NATO Scientific Affairs Division, 1989.

Hanak et al. "A New Method To Analyze Multiexponential Transients For Deep–Level Transient Spectroscopy" J. Appl. Phys. 67 (9), 1 May 1990.

Kim et al. "Digital Deep Level Transient Spectroscopy Considered For Discrimination . . . " Jrnl. of Electronic Materials, vol. 17, No. 2, 1988.

Dast et al. "Deep–Level Transient Spectroscopy (DLTS) Analysis of Defect in Semiconductor Alloys" Semicond. Sci., Technol. 3 (1988) 1177–1183.

*Primary Examiner*—Emanuel T. Voeltz
*Assistant Examiner*—Kyle J. Choi
*Attorney, Agent, or Firm*—Hopkins & Thomas; Scott A. Horstemeyer

[57] ABSTRACT

A computer-based deep level transient spectroscopy (DLTS) system (10) efficiently digitizes and analyzes capacitance and conductance transients acquired from a test material (13) by conventional DLTS methods as well as by several transient methods, including a covariance method of linear predictive modeling. A unique pseudo-logarithmic data storage scheme allows each transient to be tested at more than eleven different rates, permitting three to five decades of time constants τ to be observed during each thermal scan, thereby allowing high resolution of closely spaced defect energy levels. The system (10) comprises a sensor (12) for detecting capacitance and/or conductance transients, a digitizing mechanism (14) for digitizing the capacitance and/or conductance transients, preamplifiers (16a, 16b) for filtering, amplifying, and for forwarding the transients to the digitizing mechanism (14), a pulse generator (18) for supplying a filling pulse to the test material (13) in a cryostat (24), a trigger conditioner for coordinating the timing between the digitizing mechanism (14) and the pulse generator (18), and a temperature controller (26) for changing the temperature of the cryostat (24).

19 Claims, 17 Drawing Sheets

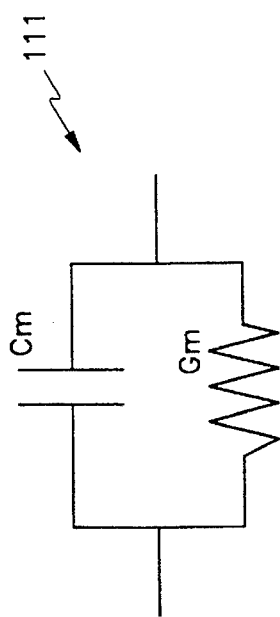
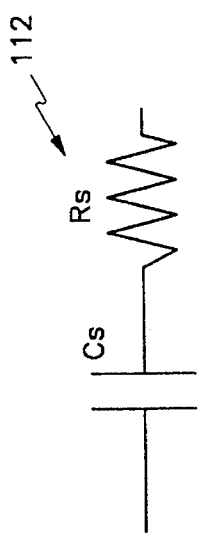
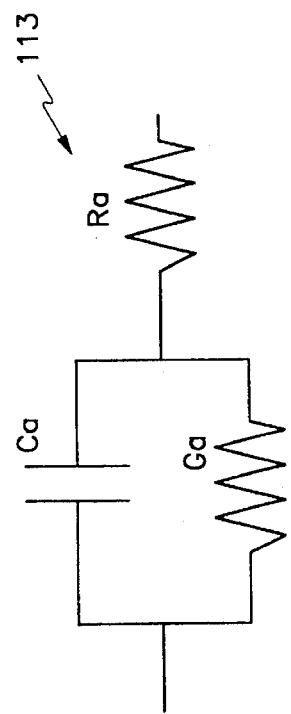
Fig. 6A
Fig. 6B
Fig. 6C

DEEP LEVEL TRANSIENT SPECTROSCOPY (DLTS) SYSTEM AND METHOD

FIELD OF THE INVENTION

The present invention generally relates to quantitatively and qualitatively analyzing the contents of semiconductor materials, and more particularly, to a deep level transient spectroscopy (DLTS) system and method for quickly and accurately measuring the activation energy, density, and capture cross-section of traps within a material.

BACKGROUND OF THE INVENTION

Certain impurities in a material give rise to localized energy levels in the material which can trap either electrons or holes. These localized energy levels, or traps, lie relatively deep in the forbidden energy band gap of the material as compared with the relatively shallow levels resulting from the intentional introduction of donors or acceptors in the material due to other types of impurities.

It is well known in the art that by measurement of the capacitance change versus time of the depletion region, or space charge layer near rectifying junctions in semiconductor devices, the activation energy (energy level; $E_T$), the density ($N_T$), and the capture cross-section ($\sigma$; the capture rate is a constant times $\sigma$) of traps in the band gap can be determined. In other words, the change of the occupancy of the localized states in the forbidden gap can be measured as a change in capacitance. Deep level transient spectroscopy (DLTS) is one of the most powerful tools for measuring these localized states. In DLTS systems, the localized states are periodically filled and emptied, and the amplitude of the resulting periodic capacitance change is determined by the concentration of the energy states, while the kinetics thereof are determined by the activation energies and thermal capture cross-sections of the localized states as a function of temperature. The occupancy of the localized states are changed by pulses, such as voltage, current, or light pulses, which are applied to a rectifying junction in the material. The DLTS method and the instruments utilizing this method are indispensable factors of development and quality control in the field of semiconductor devices.

Conventional DLTS methods generally involve constructing and analyzing a spectrum obtained from capacitance transients over a temperature range. Well known methods of constructing these spectrums include the boxcar technique, the rectangular ("lockin style") technique, and the Miller correlator technique, all as described in for example, Miller et seq., "Capacitance Transient Spectroscopy," Ann. Rev. Metr. Sci., pp. 348–377 (1977).

For further discussions in regard to the DLTS methods, see A. Rohatgi, "Application of DLTS Technique for Study of Junctions and Interfaces," Proceedings of the National Vacuum Symposium, pp. 115–133 (December 1979) and Miller et seq., "Capacitance Transient Spectroscopy," Ann. Rev. Metr. Sci., pp. 348–377 (1977). Furthermore, known patents which provide systems and methods for DLTS include U.S. Pat. No. 5,047,713 to Kirino et al., U.S. Pat. No. 4,839,588 to Jantsch et al., U.S. Pat. No. 4,571,541 to Frenczi et al., U.S. Pat. No. 4,437,060 to Frenczi et al., U.S. Pat. No. 4,208,624 to Miller, U.S. Pat. No. 3,943,442 to Fletcher et al., U.S. Pat. No. 3,859,595 to Lang, and U.S. Pat. No. 3,605,015 to Copeland.

Many computer-controlled systems for performing DLTS techniques are also known in the art. However, these computer-controlled systems are generally expensive and are difficult to build. Additionally, conventional DLTS techniques suffer from at least one very important limitation: they cannot resolve closely spaced energy levels $E_T$ or distributed energy levels $E_T$ within the band gap. In recent years, many researchers have attempted to extend the power of DLTS beyond this inherent limitation by using different types of transient analyses, including nonlinear least squares fitting, spectral analysis DLTS (SADLTS), fast fourier transform (FFT), method of moments, correlation method of linear predictive modeling, modulation function methods, and mixed methods. However, most commercial DLTS systems do not lend themselves to digitization of the transients without some modifications that can be, at best, somewhat cumbersome and, at worst, very restrictive. Specifically, it is difficult and/or time consuming to observe the transient over many decades of time without manual intervention due to the nonintegrated nature of the pulse generation and sampling processes.

Thus, a heretofore unaddressed need exists in the industry for an inexpensive and flexible computer-controlled DLTS system and method for quickly and accurately measuring characteristics of traps within a material, including the activation energy ($E_T$), the density ($N_T$), and the capture cross-section ($\sigma$) of the traps, using transient analysis.

SUMMARY OF THE INVENTION

Briefly described, the present invention is a system and method for performing DLTS analysis on a test material in order to measure the characteristics of traps within the test material, including the activation energy ($E_T$), the density ($N_T$), and the capture cross-section ($\sigma$) of the traps. In the context of this document, "DLTS" refers to not only spectrum analysis, but also transient analysis. Moreover, "test material" means any material, junction, or device to be tested or analyzed.

The system, which performs the novel methodology, comprises a sensor for detecting capacitance transients and/or conductance (1/resistance) transients, a digitizing board for digitizing the capacitance and/or conductance transients, a preamplifier board for filtering and amplifying the transients, a pulse generator with pulse application circuit for supplying a pulse to the test material, and a temperature controller for changing the temperature of the test material.

An important feature of the present invention is the ability of the system to retrieve either conductance or capacitance transients, or both, from test materials. This feature provides extreme flexibility in measuring characteristics of test materials and provides for a wide range of possible test materials. Further, the ability to retrieve conductance transients enables very accurate DLTS analysis of high resistance test materials. Other parameters that can be measured independently or simultaneously with the capacitance and/or conductance include the sample bias voltages and currents.

Another important feature of the present invention is a unique pseudo-logarithmic storage scheme which is implemented by the system software which controls the aforementioned system. The pseudo-logarithmic storage scheme allows each transient to be sampled at more than eleven different rates, permitting three to five decades of time constants to be observed during one thermal scan. This permits high resolution measurement of closely spaced energy levels as well as distributed energy levels.

More specifically, the method is implemented as follows. A pulse is applied to the test material using the aforementioned system. The capacitance and/or conductance of the material versus time is measured. A sequence of data points is generated. Each data point is representative of the capacitance or conductance of the material at a corresponding time. A plurality of subsets of the data points are selected for analysis. Each subset is generated by selecting every $x^n$th point in the sequence, where x is a positive number greater than 1 and where n defines each subset. In the preferred embodiment, x=2 for all subsets and n=1, 2, etc., to thereby define respective subsets 1, 2, etc. By selecting the subsets in accordance with the present invention, each subset contains data points uniformly spaced in time, and each subset differs from both preceding and following subsets by factor of x (preferably, 2), thus implementing a "pseudo-logarithmic" data compression. Finally, the subsets are utilized to determine a time constant $\tau$, which can be used ultimately to accurately determine the defect energy level $E_T$ and the capture cross-section $\sigma$.

Another important feature of the present invention is the implementation of a covariance method of linear predictive modeling for analyzing the transients retrieved by the system. In the covariance method, the transient data is directly analyzed in order to provide very high energy resolution for both capacitance and conductance calculations.

Other objections, features, and advantages of the present invention will become apparent to one of skill in the art upon examination of the following drawings and detailed description.

BRIEF DESCRIPTION OF THE DRAWINGS

The present invention can be better understood with reference to the following drawings. The drawings are not necessarily to scale, emphasis instead being placed upon clearly illustrating principles of the present invention.

FIGS. 6A through 6C show equivalent circuit diagrams for test materials under analysis by the novel system of FIG. 3.

DETAILED DESCRIPTION OF THE PREFERRED EMBODIMENT

I. Deep Level Transient Spectroscoy (DLTS) Theory

Figure 1:
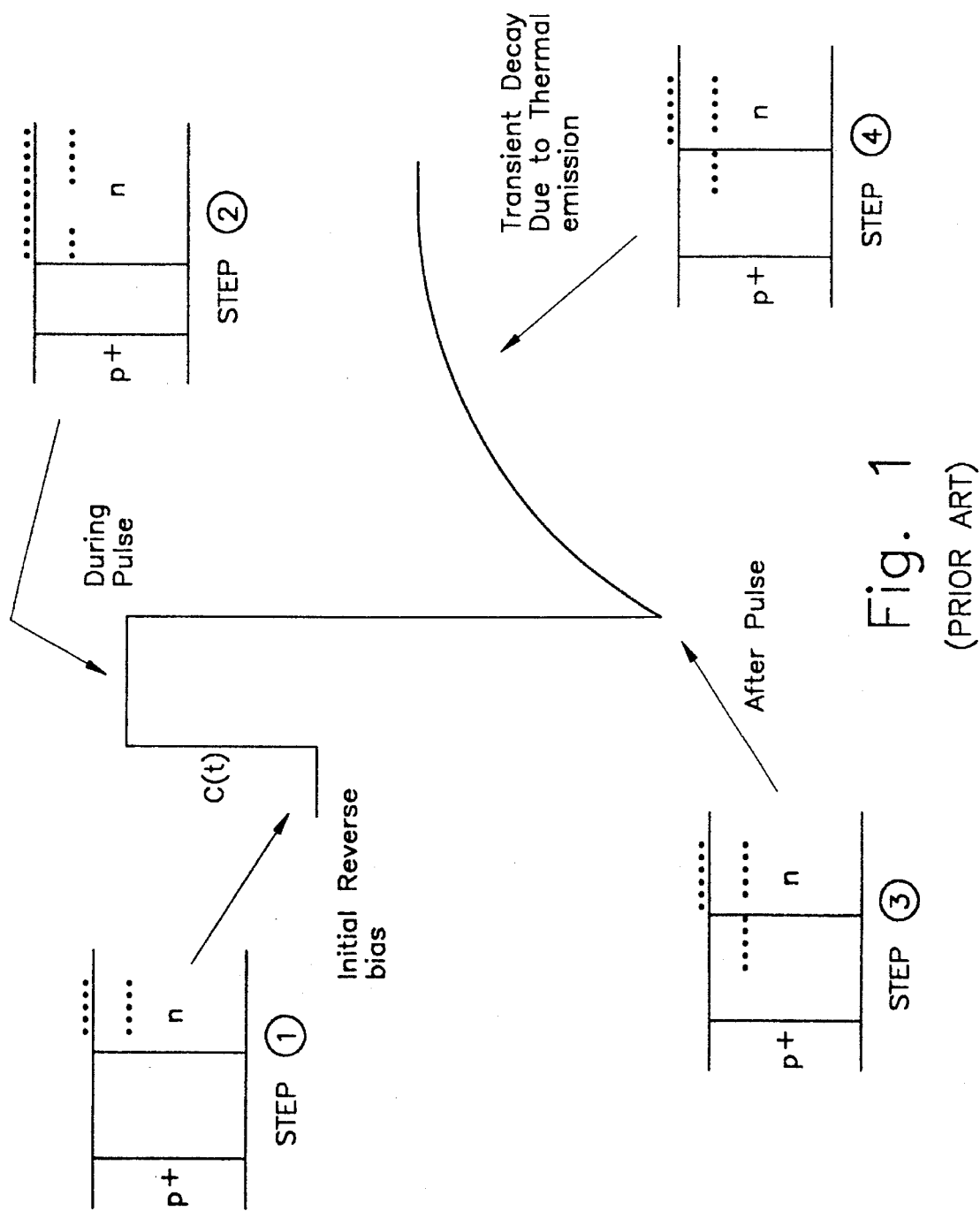
FIG. 1 shows a capacitance transient utilized in deep level transient spectroscopy (DLTS) techniques.

With reference now to the figures wherein like reference numerals designate corresponding parts throughout the several views, FIG. 1 shows a capacitance transient used in DLTS. DLTS is a capacitance transient technique in which transients are generated by applying voltage pulses repetitively to a reverse biased depletion region of a test material or device. The DLTS technique can be used to study traps in a junction region or at an interface. FIG. 1 illustrates in four steps how the capacitance transients are generated from the traps present at a junction. Step 1 shows a reverse biased device which, in step 2, is pulsed to fill the traps in the depletion region. This pulse is often called a filling pulse or an injection pulse. At the end of the pulse, step 3, the device capacitance does not return to its original value because of the trap charges at the deep level. At temperatures where sufficient excitation energy is present, these trapped charges are released by thermal emission during the period between the pulses, as indicated at step 4, producing a capacitance transient.

Figure 2B:
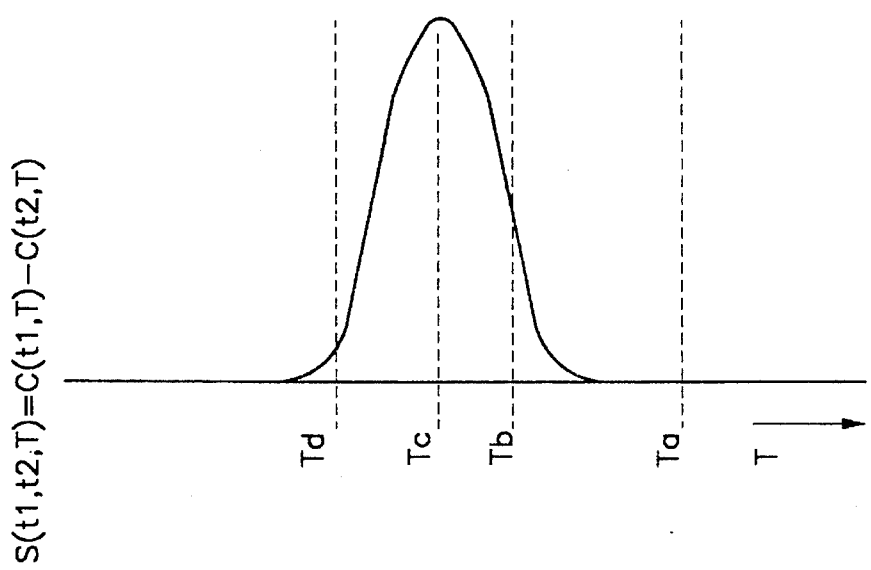
FIG. 2B is a graph illustrating a conventional spectrum constructed from the plurality of capacitance transients of FIG. 2A for identifying a time constant $\tau$ over a time interval $t_1<t<t_2$.
Figure 2A:
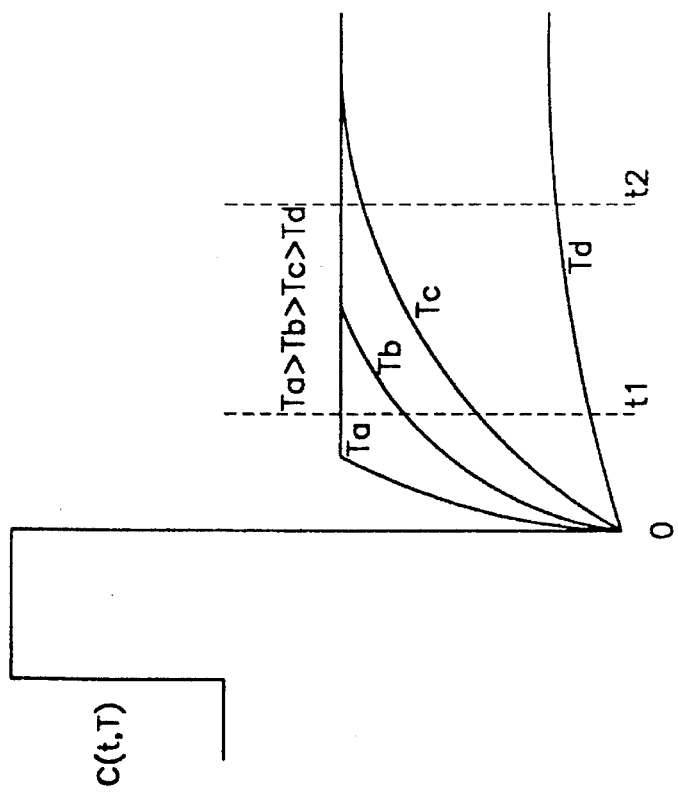
FIG. 2A is a graph illustrating a plurality of capacitance transients of FIG. 1 as a function of selected temperatures $T_a$, $T_b$, $T_c$, $T_d$ during a time interval $0<t<t_2$.

As illustrated in FIG. 2A, the device temperature is varied in order to vary the emission rate, or the time constant $\tau$, of the capacitance transient. These transients are processed in order to provide an output signal as a function of device temperature, as illustrated in FIG. 2B. As shown in FIG. 2B, the output signal as a function of device temperature passes through a maxima, or a peak, at a temperature $T_c$ where the capacitance time constant is known. The position of the peak is uniquely determined by instrument settings and the thermal emission properties of the traps. The proper choice of experimental parameters can give the energy level $E_T$, the density $N_T$, and the cross-section $\sigma$ of each trap.

II. Pseudo-Logarithmic Storage Scheme for DLTS Transient Analysis

Most existing methods used in DLTS transient analysis, though extremely diverse in approach, are extremely time consuming. Specifically, many are iterative in nature, others, like the correlation method, require many extensive calculations for each temperature. Accordingly, it would be desirable to analyze only enough data to retrieve the requisite information, i.e., the time constant $\tau$ of the transient at each temperature. If, for example, the capacitance transient time constant $\tau$ at a certain temperature $T_1$ is 250 microseconds, there is no need to observe the transient over a 1 second time period. Doing so would entail storing and processing more irrelevant data ("zeros") than relevant data ("non-zeros"). However, the time constant $\tau$ at $T_2<T_1$ may be 0.1 seconds. At this temperature, one might want to observe the transient over a one second time period, and all the data points acquired in this period would indeed be relevant.

One solution for implementing the desired methodology in the above example might be to manually vary the "observation window" while the measurement is progressing. This is typically performed by changing the digitation rate of the digitizer during the measurement. However, because a fully automated system is desired, this is not a viable option. Another solution is to set the observation window to 1 second in this example and simply record the data points. However, if, for example, the digitation is performed fast enough to accurately record the 250 μsec time constant $\tau$, a tremendous amount of irrelevant data is acquired at temperatures around $T_1$. Additionally, the memory required to store such data could easily exceed 500 Kbytes per temperature. This is clearly not feasible. Still another solution is to sample at many different rates at each temperature. However, because typically many transients are averaged at each temperature, the time required to average enough transients at several different rates would drastically slow the measurement and would be prohibitive.

A more efficient solution, and the one adopted by the present invention, is to sample at a fast rate for a long time but only store and/or process a limited number of data points corresponding to each of the different sample rates of interest. For example, if 131,072 data points are taken at a base sample rate of 100 kHz, one could store the first 128 (or alternatively, 256, 512, 1024, etc.) points, then extract another 128 points from the same transient starting from the original starting point, but this time taking every other data point. Another 128 points are taken at every fourth point starting from the original starting point, and so on. This storage scheme allows the transient to be observed at 100 kHz for 1.28 milliseconds, 50 kHz for 2.56 milliseconds, 25 kHz for 5.12 milliseconds, and so on, up to 97.65625 Hz for 1.31072 seconds. Thus, many decades of time can be sampled from the same transient without permanently storing or processing redundant data. Additionally, only one transient need be acquired, thereby greatly accelerating the measurement. Worth emphasizing is that if the first 64 data points of the 50 kHz sample set are included in the 100 kHz sample set and likewise for the other 9 sample sets, the original 131,072 data points can be reduced to merely 768 data points without the loss of any essential information. If more than 128 data points in each sample set are desired, than one merely needs to store more than 768 total points (example: a subset size of 256 and a base buffer size of 131,072 would require the permanent storage and processing of 1408 total points).

The foregoing process is a pseudo-logarithmic storage scheme and is an important feature of the present invention. The process can be summarized succinctly as follows. First, a pulse is applied to the test material. The capacitance and/or conductance of the material versus time is measured. A sequence of data points is generated. Each data point is representative of the capacitance or conductance of the material at a corresponding time. A plurality of subsets of the data points are selected for analysis. Each subset is generated by selecting every $x^n$th point in the sequence, where x is a positive constant greater than 1 and where n uniquely defines each subset. In the preferred embodiment, x=2 for all subsets and n=1, 2, etc., to thereby define respective subsets 1, 2, etc. By selecting the subsets in accordance with the present invention, each subset contains data points uniformly spaced in time, and each subset differs from both preceding and following subsets by factor of x (preferably, 2), thus implementing a "pseudo-logarithmic" data compression. Finally, the subsets are utilized to determine a time constant $\tau$, which can be used ultimately to accurately determine the defect energy level $E_T$ and the capture cross-section $\sigma$.

The total number of sampling rates (available subsets of the base sample rate) depends on the size of the total base buffer allocated for the transient (131,072 in the above example) and the number of points desired in each subset (subset size=128 in the above example) and can be obtained by the following equation, $$\text{Total Number of Rates} = 1 + \text{Log}_2\left(\frac{\text{TotalBaseBufferSize}}{\text{SubsetSize}}\right) \quad (1)$$

while the $i^{th}$ sample rate is given by, $$R_i = \frac{\text{Base Sample Rate}}{2^{i-1}} \quad i = 1, 2, \ldots \text{Total Number of Rate} \quad (2)$$

It is important to recognize that the different sample sets at the different rates are for the same transient decay as opposed to resetting a digitizer and acquiring a different transient. The above example is equivalent to sampling 1 transient by as many as 11 different digitizers operating in parallel, but many more combinations of observable time constant ranges, number of subsets and data point density (in time) are possible by adjusting the base buffer and subset sizes.

The foregoing novel scheme can be implemented by a digitizer that downloads data to a computer which then extracts the relevant data. However, digitizers with this amount of memory (256K in the above example) are expensive and rarely have the 12-bit precision used here. Additionally, this large amount of data requires a substantial amount of time to be transferred over a bus, even when a DMA transfer is used. A better solution is to store the transients directly in a computer memory and bypass the transfer process altogether. This is exactly what occurs in the present invention, which is described in detail hereinafter in the hardware section.

The scheme adopted by the present invention insures that transient decays which fall within a large time constant spread are optimally sampled without knowing the time constant $\tau$ ahead of time. Another advantage of the novel scheme is its inherent flexibility. Some transient analysis methods work best for non-uniform sample steps. Specifically, SADLTS and non-linear least squares fitting prefer to have the highest density of points (in time) at the beginning of the transient where the derivative with respect to time is the greatest. Regarding SADLTS, see J. Moritomo, T. Ikda, and T. Miyakawa, Mater. Res. Symp. Proc. 69, 343 (1986). Because the present invention provides for non-uniform sampling, if desired, the derivative is more accurately determined and convergence of such routines is facilitated. For such routines, all 768 data points are processed. Most of the other transient analysis methods require uniform sample spacing and thus only the appropriate subset is passed to such routines. Clearly, the scheme of data storage and processing satisfies all the requirements of all the current transient analysis methods, while optimizing the overall measurement time, processing time, as well as memory and storage requirements.

Another limitation that commercial DLTS systems impose on transient analysis is the lack of knowledge of the exact baseline capacitance. See, in this regard, H. K. Kim, T. E. Schlesinger, and A. G. Milnes, *J. Electron. Mater.* 17, 1987 (1988). In the context of this document, "baseline capacitance" means the temperature-dependent capacitance contributed by the test material itself without the effect of traps. Knowing the value of the baseline capacitance is essential for many transient analysis routines for eliminating the DC component of the decay. In the present invention, the capacitance verses temperature curve (and conductance versus temperature) is recorded as the sample cools down under reverse bias. Thus, even at temperatures where deep traps emit their carriers very slowly, the baseline capacitance (and baseline conductance) is known to within a few femtofarads.

III. System Hardware

A. General Description

Figure 3:
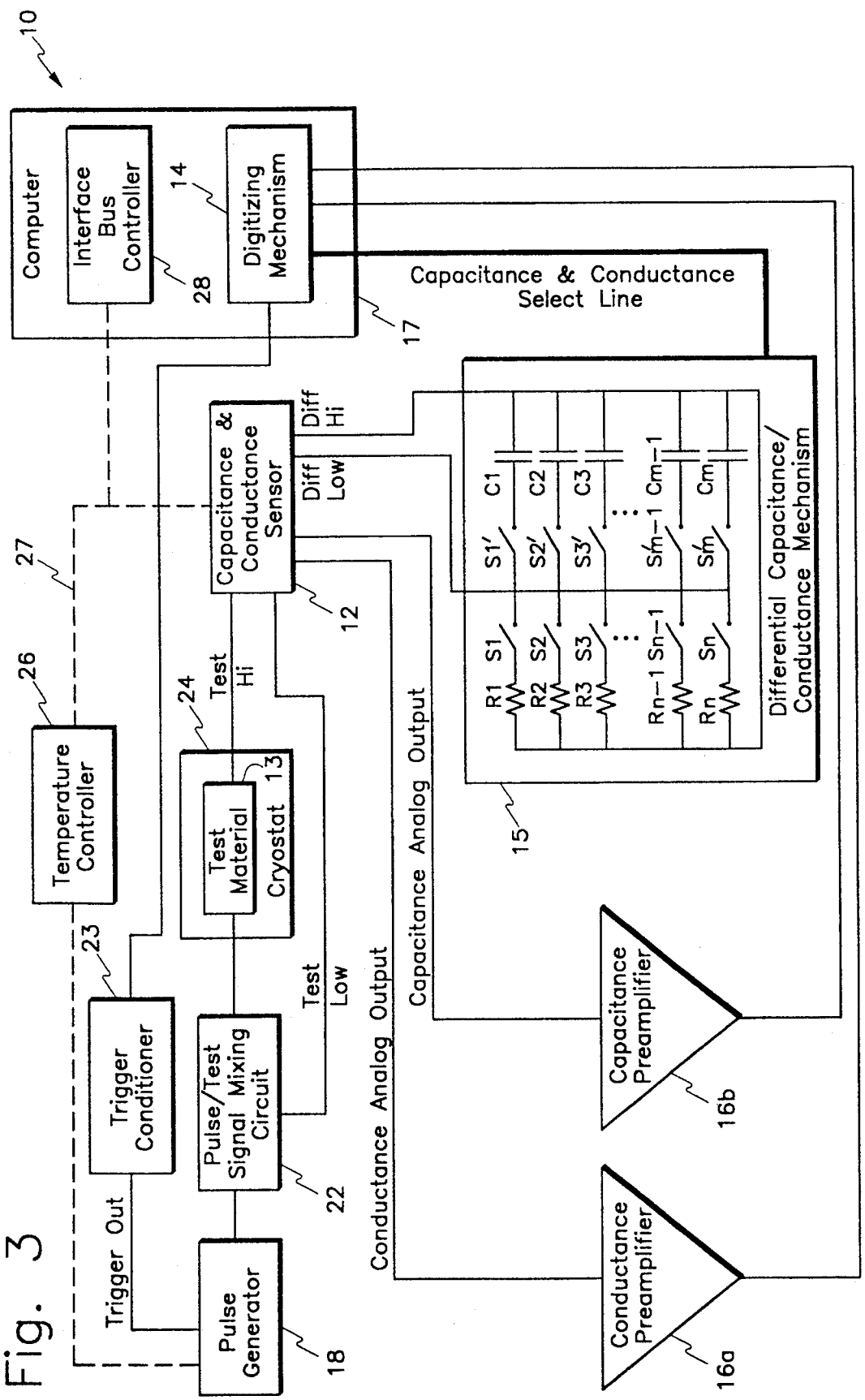
FIG. 3 is a block diagram of the novel system of the present invention.

A schematic diagram of the hardware of the present invention is shown in FIG. 3. The system 10 is based around a capacitance/conductance sensor 12, preferably a model 7200 sensor manufactured by and commercially available from Boonton, Inc., U.S.A. The instantaneous capacitance and instantaneous conductance of a test material 13, shown schematically as a diode in FIG. 3, are both read concurrently by the sensor 12 over time and the respective signals are fed to corresponding preamplifiers 16a, 16b, which amplify and filter the respective signals.

Next, the signals are fed to respective analog-to-digital converter (ADC) inputs (max. ±10 volt input range) of a digitizing mechanism 14, preferably a Data Translation DT2821-F data acquisition board manufactured by and commercially available from Data Translation, Inc., U.S.A. situated in a computer 17. The DT2821-F digitizing mechanism 14 is driven by an ATLAB device driver, manufactured by and commercially available from by Data Translation, Inc., U.S.A. The DT2821-F digitizing mechanism 14 operates at a maximum rate of 150 KHz and minimum rate of 0.5 Hz and stores the data directly into any AT compatible computer memory via direct memory access (DMA) data transfers. This feature eliminates the need for downloading data from a remote digitizer. Furthermore, all processing of data, including averaging, displaying, and even calculation of the conventional DLTS spectrum points, is performed immediately after the data at each temperature is acquired.

The DT2821-F digitizing mechanism 14 also contains a 16-bit digital output port which is used to output a binary code to a differential capacitance/conductance mechanism 15. The differential capacitance/conductance mechanism 15 has a relay bank comprising switches S1-Sn, S1'-Sm' for selectively switching, based upon the binary code received from the digitizing mechanism 14, different resistances R1-Rn and/or capacitances C1-Cm, respectively, across the differential impedance leads of the Boonton 7200 sensor 12. This feature is used to offset the baseline capacitance and baseline conductance of the test material 13 so that at each temperature, the sensor 12 is operating in the most sensitive range. In the preferred embodiment, the applied capacitances can offset baseline capacitances ranging from 0 pF to 256 pF in increments of 0.125 pF, and the applied resistances can offset baseline conductances ranging from 0 $\mu$S ($\mu$mho (the current S.I. unit for conductance is the Siemen which is equal to a mho)) to 512 $\mu$S in increments of 0.25 $\mu$S.

The filling pulse is supplied by a pulse generator 18, preferably a model HP8112A pulse generator manufactured by and commercially available from Hewlett Packard Company, U.S.A. The filling pulse is actually applied to the test material 13 via a mixing circuit 22, which comprises a bandpass and notch filter network for passing the capacitance/conductance test signal while blocking other components resulting from the test pulse. Pulses which are less than 100 microsecond in duration may be applied, if desired using a pulse transformer as the mixing circuit.

Concurrently when the mixing circuit 22 applies the filling pulse, a trigger conditioner 23 supplies a trigger signal to the digitizing mechanism 14 so that the digitizing mechanism 14 can commence data acquisition. Preferably, the trigger conditioner 23 is a model 74121 one-shot device which can issue a 1 $\mu$S pulse driven by the trigger output of the pulse generator 18. This one-shot device 23 insures that the trigger pulse sent to the DT2821-F digitizing mechanism 14 is of proper polarity and uniform width. This feature is necessary because in triggered mode, the HP8112A pulse generator 18 has a trigger pulse width that is a function of the output pulse width and is always longer than the maximum external trigger pulse width allowed by the DT2821-F digitizing mechanism 14.

In the preferred embodiment, the test material 13 is held in a cryostat 24, preferably an APD closed cycle helium cryostat, and the temperature is read from the cryostat and controlled by a temperature controller 26, preferably a model 330 temperature controller manufactured by and commercially available from Lakeshore Cyrotronics, Inc., U.S.A.

The sensor 12, pulse generator 18, and temperature controller 26 are interfaced via an interface bus 27, which is controlled by an interface bus controller 28. In the preferred embodiment, the interface bus 27 is a general purpose interface bus (GPIB) and the bus controller 28 is a GPIB control card, both manufactured by and commercially available from National Instruments, Inc., U.S.A. The temperature, baseline capacitance, and baseline conductance are read from the bus 27 before each initial filling pulse is triggered at each preselected measurement temperature. The temperature is used to accurately record the baseline capacitance and conductance for trap concentration calculations and for use in some of the transient analysis routines. The baseline capacitance/conductance values are used for zeroing the baseline impedances in the differential capacitance/conductance mechanism 15.

B. Overall Operation

Each measurement progresses as follows using the system 10. Preferably, although not necessary, a menu driven, hardware setup program is utilized for interacting with the user. The hardware setup program inputs all the essential hardware and measurement options. Using the GPIB interface bus 27, the instruments are setup to implement the chosen options.

The Boonton 7200 sensor 12 is set to auto range and the differential capacitance/conductance mechanism 15 is initially set to 0 pF, 0 $\mu$S for the capacitance and conductance, respectively. In order to cancel out the stray capacitance and conductance, the sensor 12 is slightly disengaged from the test material 13, and an auto zero command is issued to the Boonton 7200 sensor 12. Next, the sensor 12 is contacted with the test material 13 and the test material 13 is cooled to approximately 5 degrees below the start temperature and held there for 5 minutes to allow the cryostat 24 to stabilize and to allow the auto-tuning temperature controller 26 to adjust its proportional integral differential (PID) control parameters automatically. During the cooling process and while the test material 13 is under reverse bias, the capacitance versus temperature curve and conductance versus temperature curve are recorded in order to supply the transient routines with an accurate accounting of the baseline capacitance and baseline conductance.

The test material 13 is now warmed to the selected start temperature where the transient data acquisition begins. The capacitance and/or conductance is measured across the GPIB bus 27 and the appropriate capacitance C1-Cm and resistance R1-Rn is switched onto the differential terminals of sensor 12. This action cancels the baseline capacitance down to at least 0.0625 pF and the conductance down to at least 0.125 $\mu$S.

The capacitance and/or conductance is again measured, but this time they are measured by the DT2821-F digitizing mechanism 14. After a pulse signal is initiated by the pulse generator 18, a trigger signal is initiated by the trigger conditioner 23 and forwarded to the external trigger input of the DT2821-F digitizing mechanism 14. After the digitizing mechanism 14 receives the trigger signal, the data acquisition begins. As the data buffers (described in detail in the next section) fill, the ATLAB device driver, which drives the DT2821-F digitizing mechanism 14, releases the data to the system program 50 for the purpose of processing.

Thus, directly after each single transient is acquired, the data averaging starts. Only the data points of interest are averaged, increasing the speed dramatically. After the data is averaged, another trigger signal is issued by the computer 17 to the pulse generator 18 using the interface bus controller 28 and the aforementioned process is repeated until the pre-selected number of transients at each temperature is acquired. The average temperature, temperature standard deviation, baseline capacitance (before the first pulse), baseline conductance, and the averaged transient data are stored. The transient is then displayed, and the conventional DLTS spectrum may be calculated, displayed, and stored. This process is repeated at pre-selected temperatures until the final temperature is reached.

C. Timing

Figure 4:
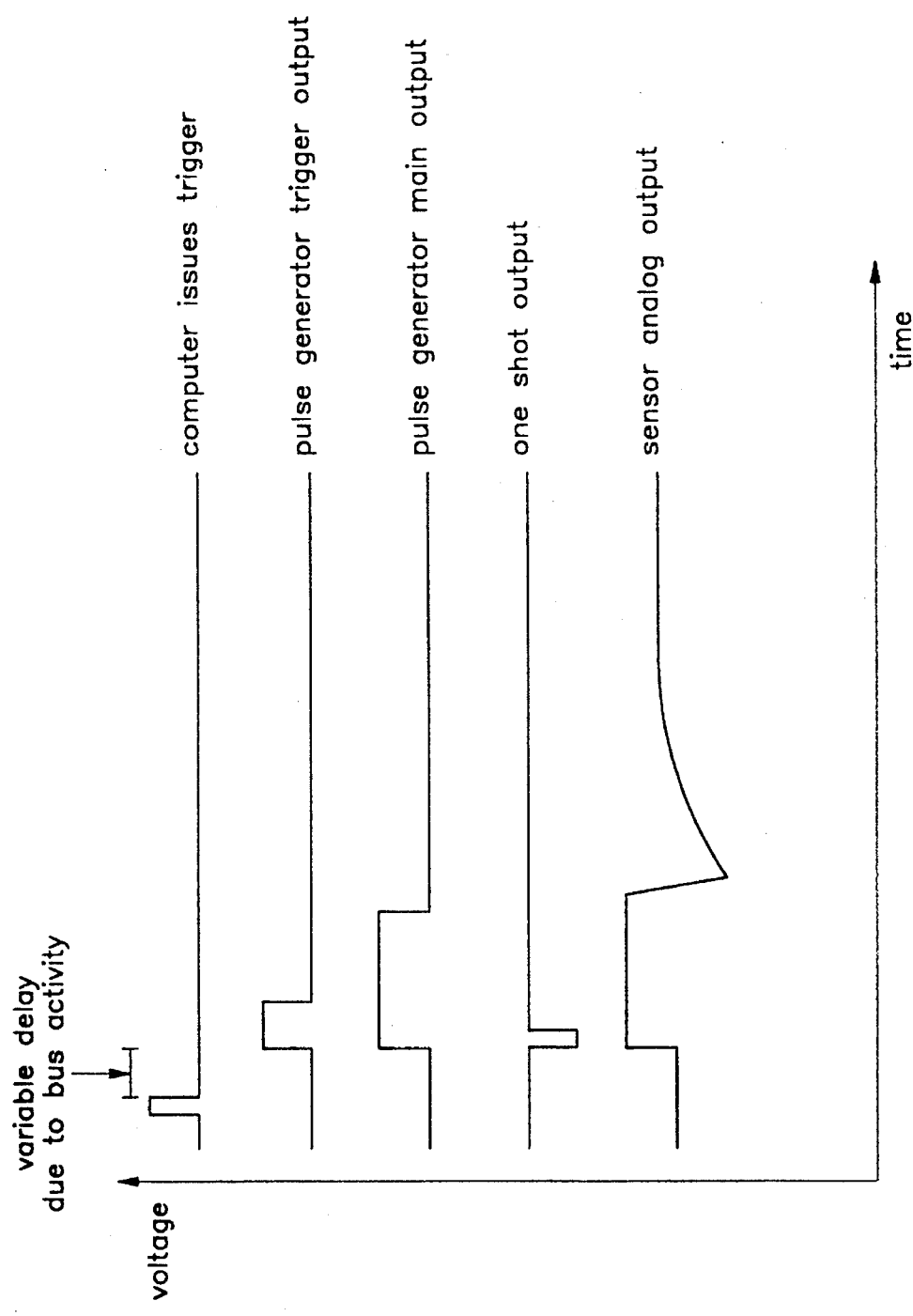
FIG. 4 is a graph illustrating the timing of signals implemented by the system components of FIG. 3 for generating the capacitance and/or conductance transients in accordance with FIGS. 1 and 2.

An advantage of the system 10 is that the usual complicated timing circuitry found in conventional computerized DLTS systems has been reduced to a single inexpensive TTL integrated circuit chip, the 74121 one-shot device 23. The timing of the system 10 is summarized in FIG. 4. With reference to FIG. 4, the computer 17 issues a trigger command to the pulse generator 18 through the GPIB bus controller 28 and GPIB bus 27. Because the timing of the data acquisition is crucial and many factors such as GPIB bus activity, and even the AT computer bus activity, affect the starting time of the data acquisition, the external trigger conditioner 23 is used to trigger the DT2821-F digitizing mechanism 14.

Since the falling edge of the 74121 one shot device 23 corresponds to the beginning of the output pulse within a negligible propagation delay, the data acquisition is started at the beginning of the filling pulse. However, the transient event to be observed begins at the end of the filling pulse. This is easily accounted for by storing this time period of the signal in a different memory buffer than that of the transient signal of interest. This is also an easy way to account for the relative inaccuracy in the pulse width of the HP8112A pulse generator 18 (5%). This configuration is implemented by initially sampling the filling pulse on one of the spare inputs of the DT2821-F digitizing mechanism 14. The pulse width can then be accurately measured and accounted for. This is further explained in the software section that follows.

D. Boontoon 7200 Sensor

The use of the Boonton 7200 sensor 12 brings many improvements to the system 10 even for the conventional DLTS measurement. In some test materials 13, such as CdS[28] (the superscripts here refer to references in the paper I wrote not atomic numbers) and high resistivity Si and Ge[26] (same here), the series conductance of the test material 13 is not negligible. Thus, the conventional capacitance DLTS cannot be properly employed. Conductance DLTS provides an answer to such problems, and conductance transients can be acquired by the Boonton 7200 sensor 12.

Further, the response time and overload recovery time of the Boonton 7200 sensor 12 is optimum. This feature allows a smaller delay from the end of the filling pulse to the beginning of the data acquisition which improves the detection limit for shallow traps and traps with low concentrations. When the filling pulse is small enough to keep the capacitance within the 2 pF capacitance meter range, the total time for full recovery (settling to within 0.1% of its final value) is simply equal to the instruments 50 µS response time. If the pulse drives the capacitance out of the 2 pF range, then more time is required to recover from the overload. Under these conditions, the time required to fully recover is 175 µS. When the pulse drives the test material 13 into forward bias, the amplifier clamps and requires 500 µS to recover fully. This nonideal behavior when pulsing into forward bias has been observed by other researchers. These recovery times are significantly shorter than the 1 ms recovery times of the modified older models.

E. Preamplifier

The capacitance and conductance signals are passed through respective preamplifiers 16a, 16b which amplify the signals by a factor of 5, in the preferred embodiment. This makes full use of the entire ±10 volt input range of the DT2821-F digitizing mechanism 14. Additional gain factors of, for example, 1, 2, 4 and 8, are preferably software selectable on the DT2821-F digitizing mechanism 14 to further enhance the resolution of the system 10.

The DT2821-F digitizing mechanism 14 digitizes the signals and stores the data directly in the computer memory of computer 17. The system program 50 then extracts the relevant data points in each transient and averages them with successive transients in floating point arithmetic in order to increase the signal-to-noise ratio. The data is then stored, displayed, and then the conventional DLTS spectrum is calculated by numerically integrating the product of the transient with a selected weighting function (boxcar, rectangular/lockin or Miller's correlator). The conventional DLTS spectrum is then stored, and displayed. Since the data being manipulated is only the 768 data points in the preferred embodiment, the processing of the data is almost instantaneous.

The temperature is then incremented to the next temperature and the process is repeated. The system 10 is software intensive and can perform a variety of different measurements simply by changing the measurement parameters within the system program 50. A description of the system program 50 that controls the system 10 and manipulates data is set forth in the following Section IV.

IV. System Software

A. General Description

Figure 5A:
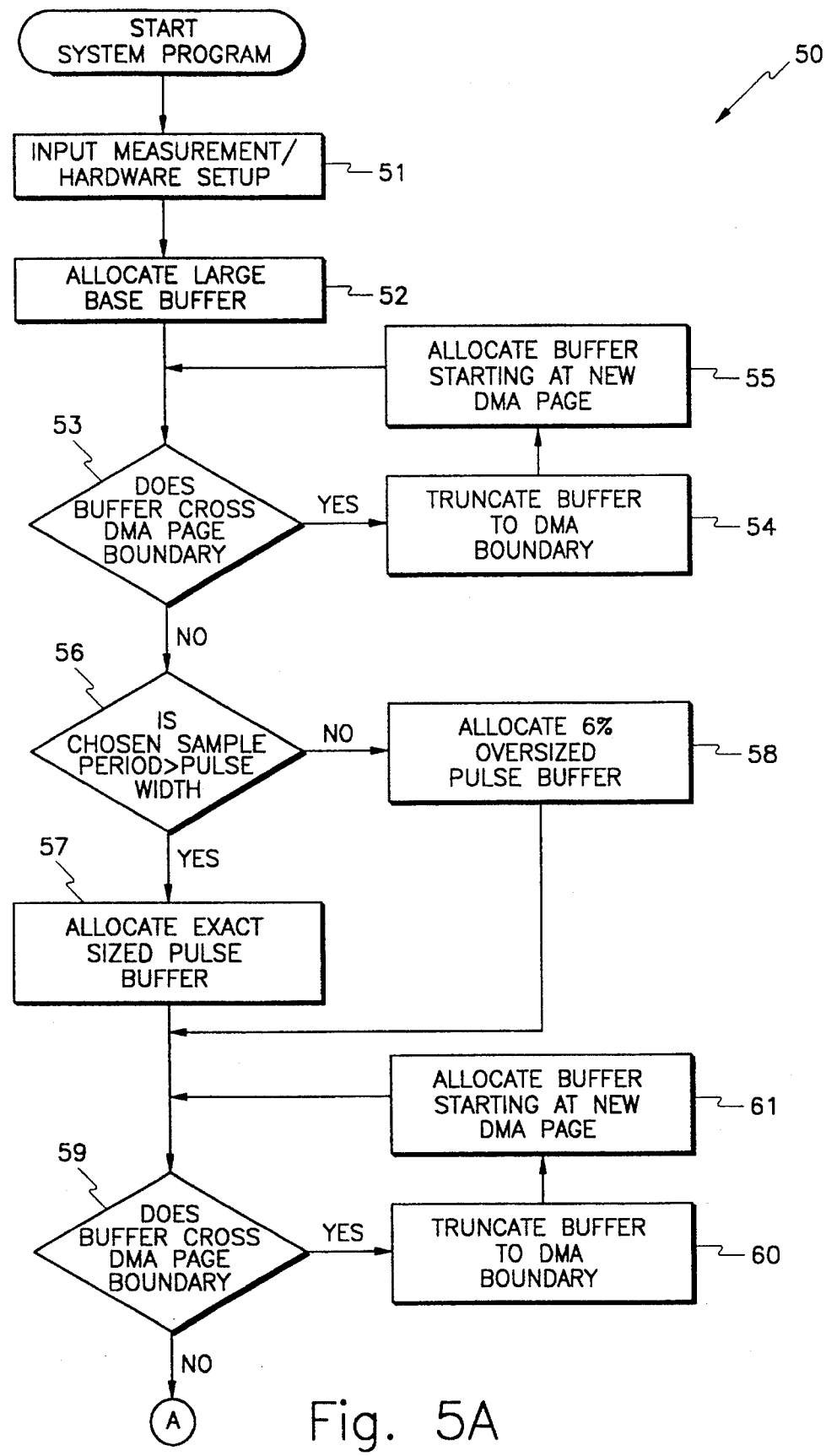
FIGS. 5A through 5I show a flow chart for a system program utilized in the present invention for controlling the system of FIG. 3.
Figure 5B:
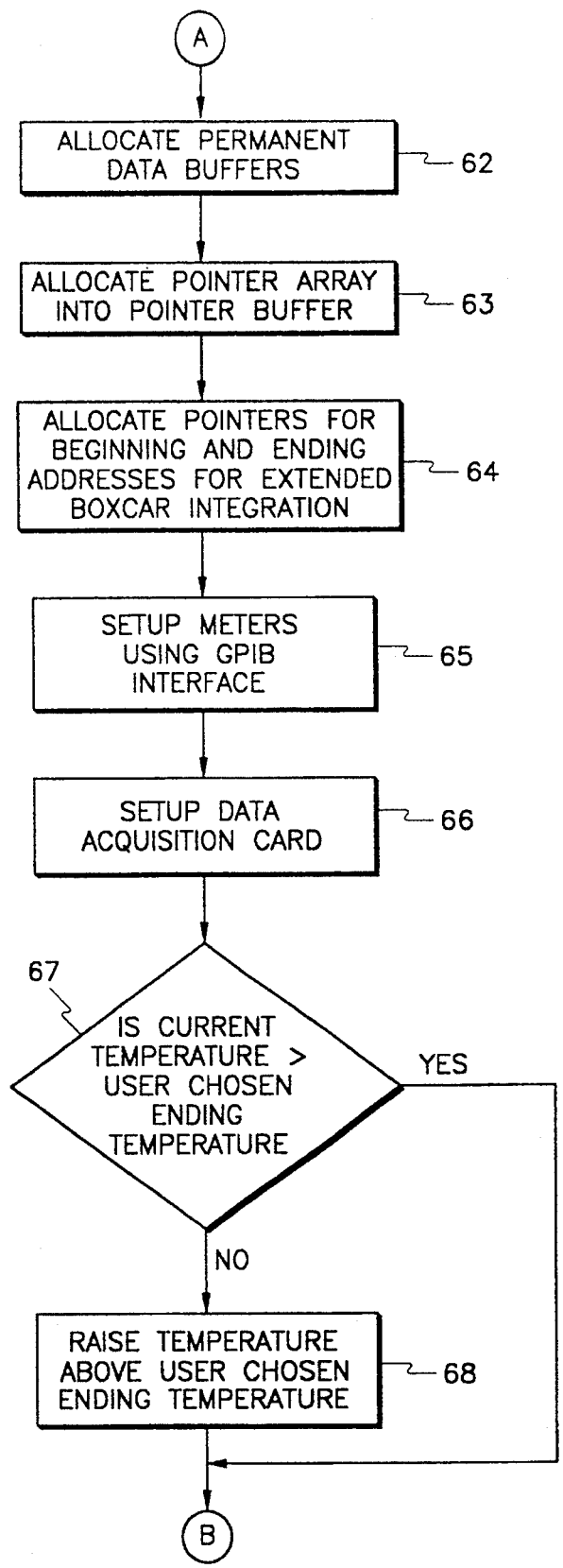
Figure 5C:
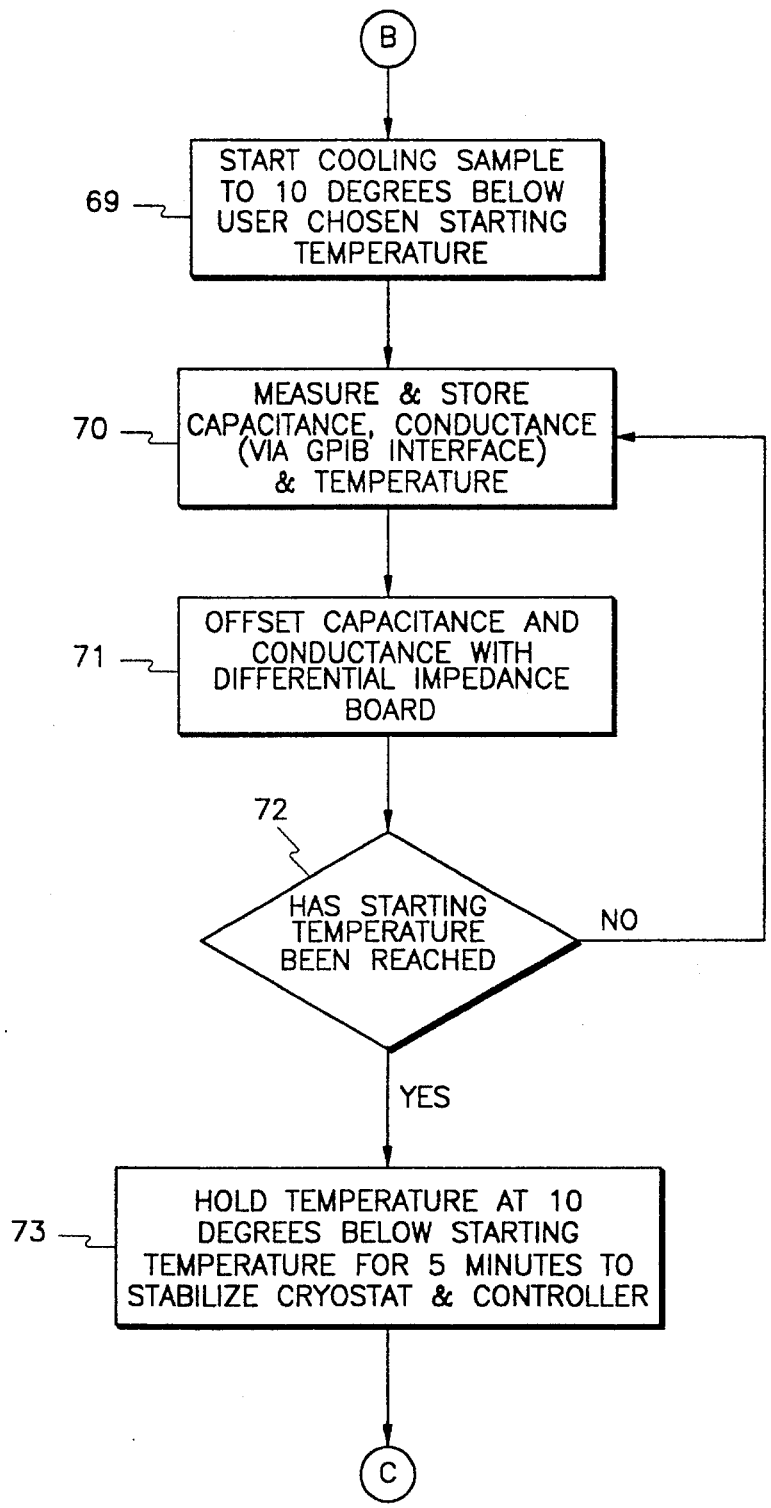
Figure 5D:
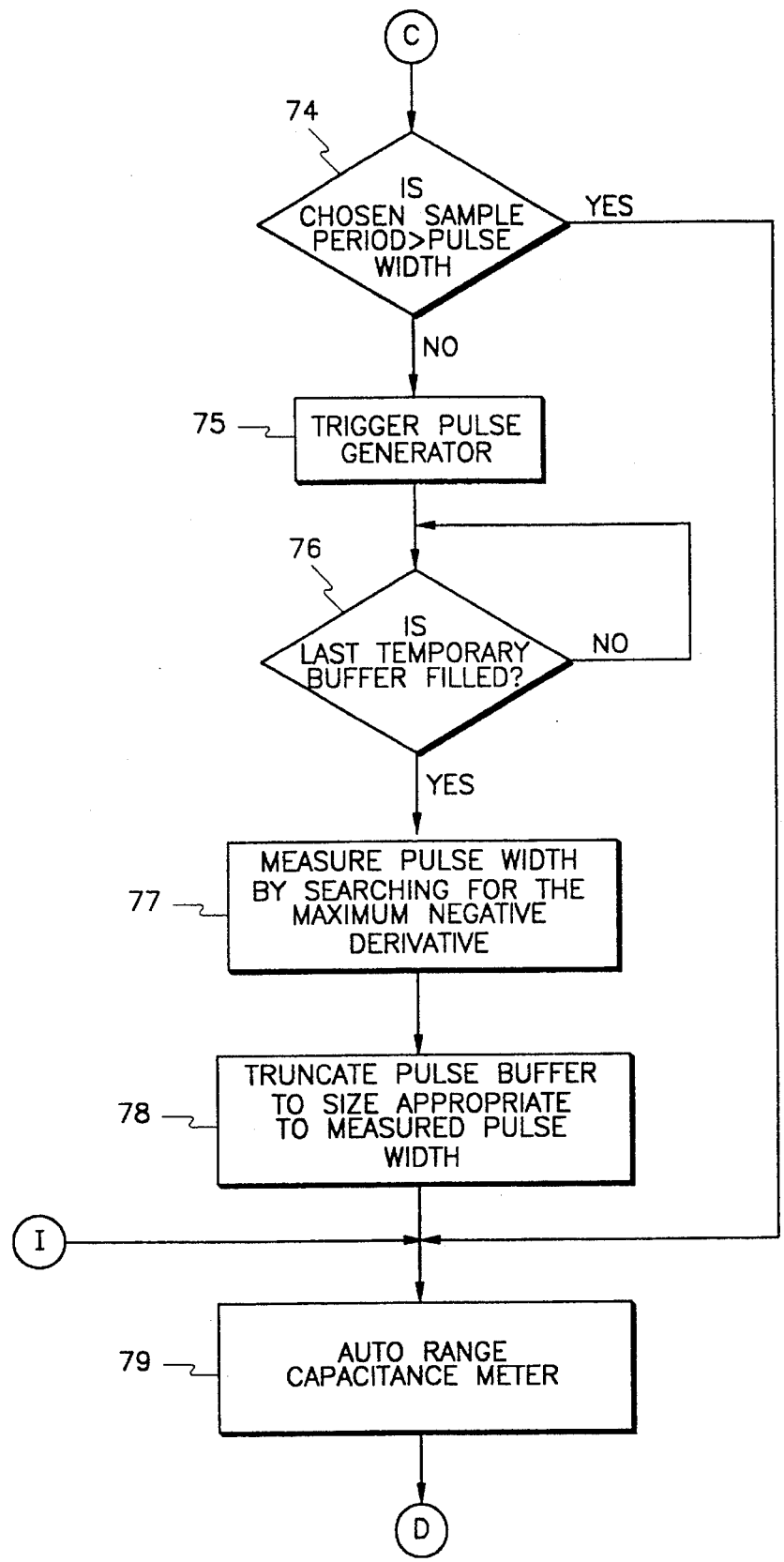
Figure 5E:
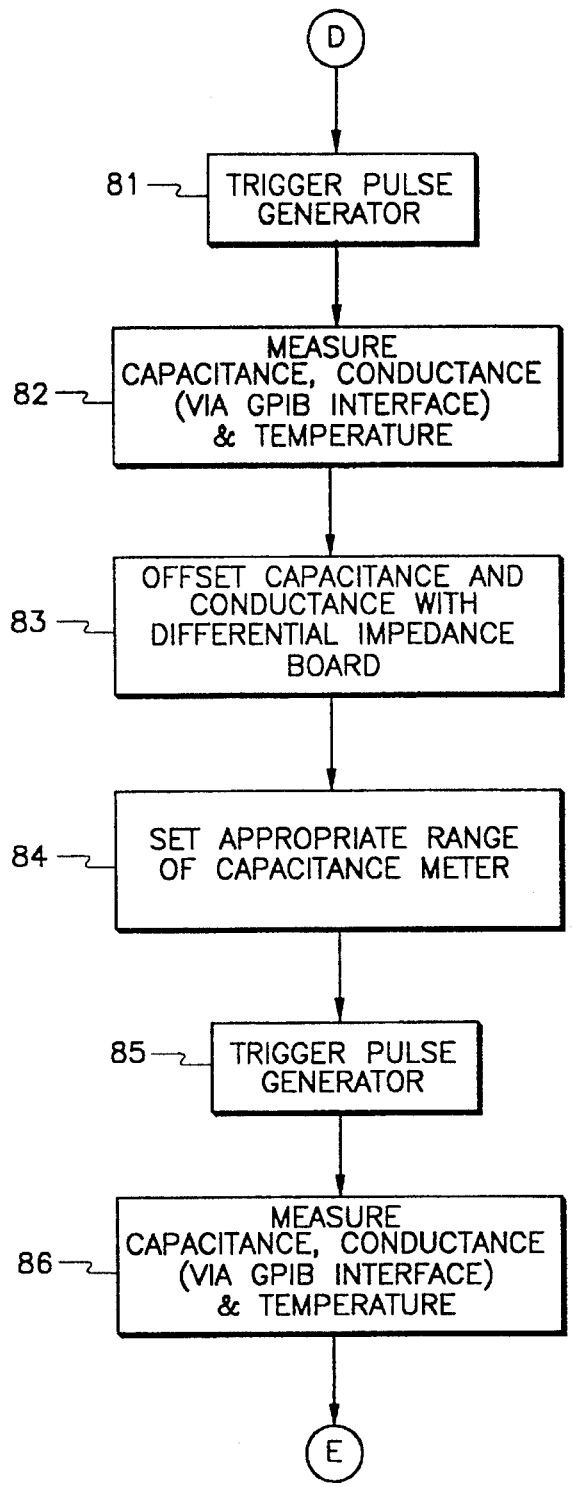
Figure 5F:
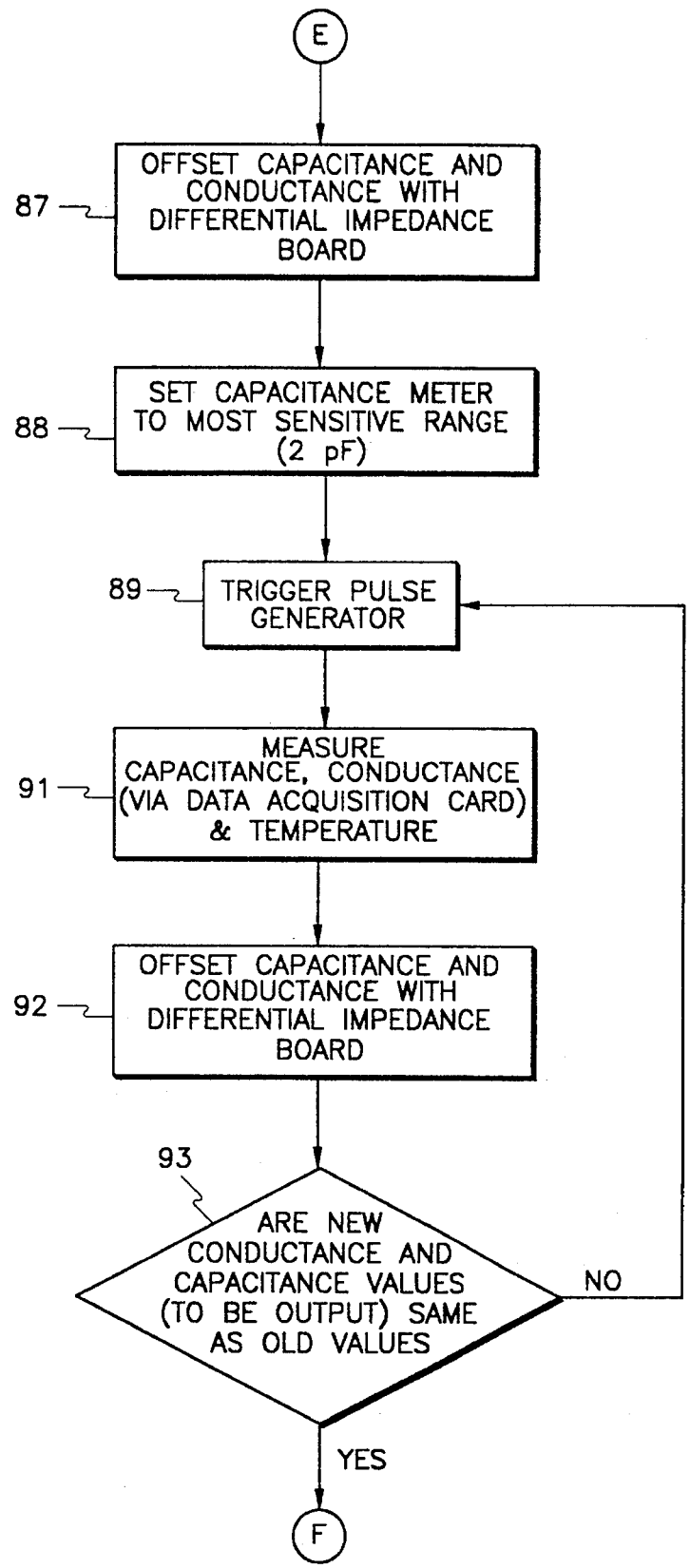
Figure 5G:
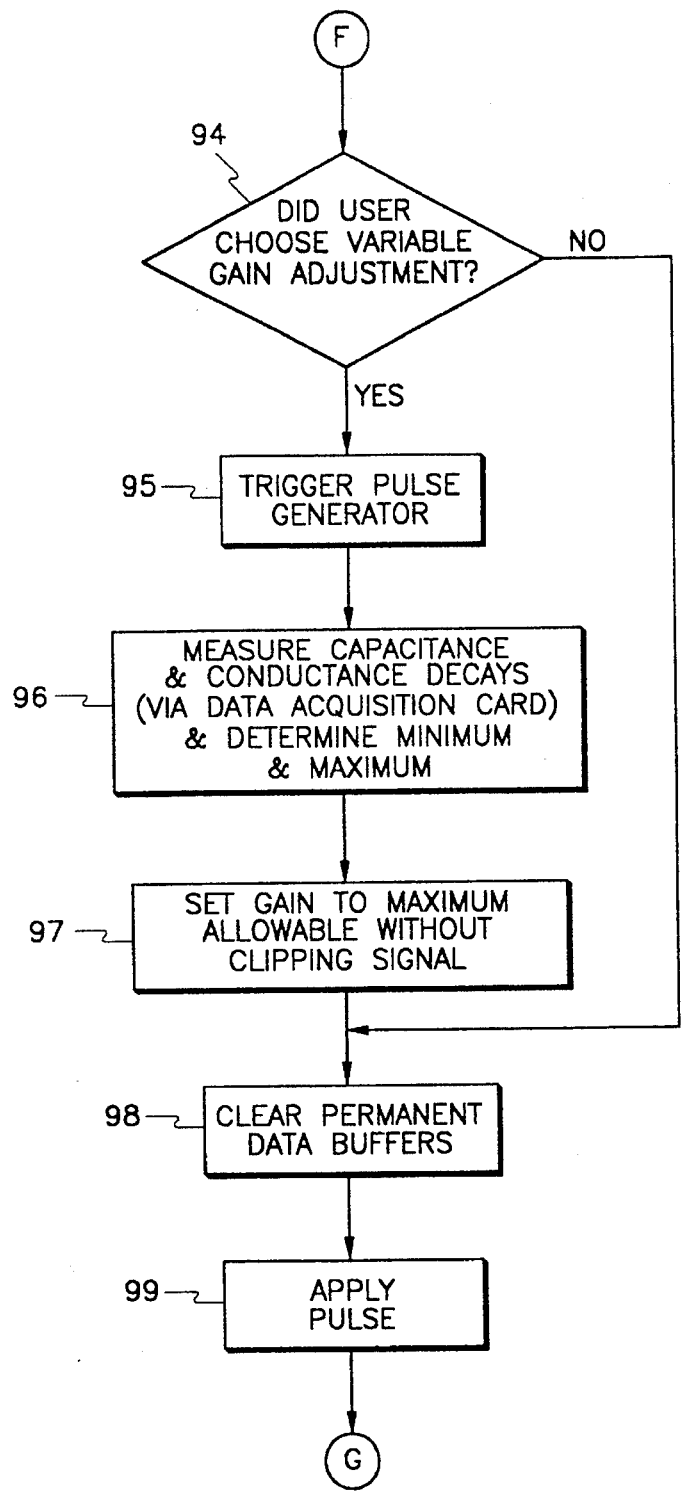
Figure 5H:
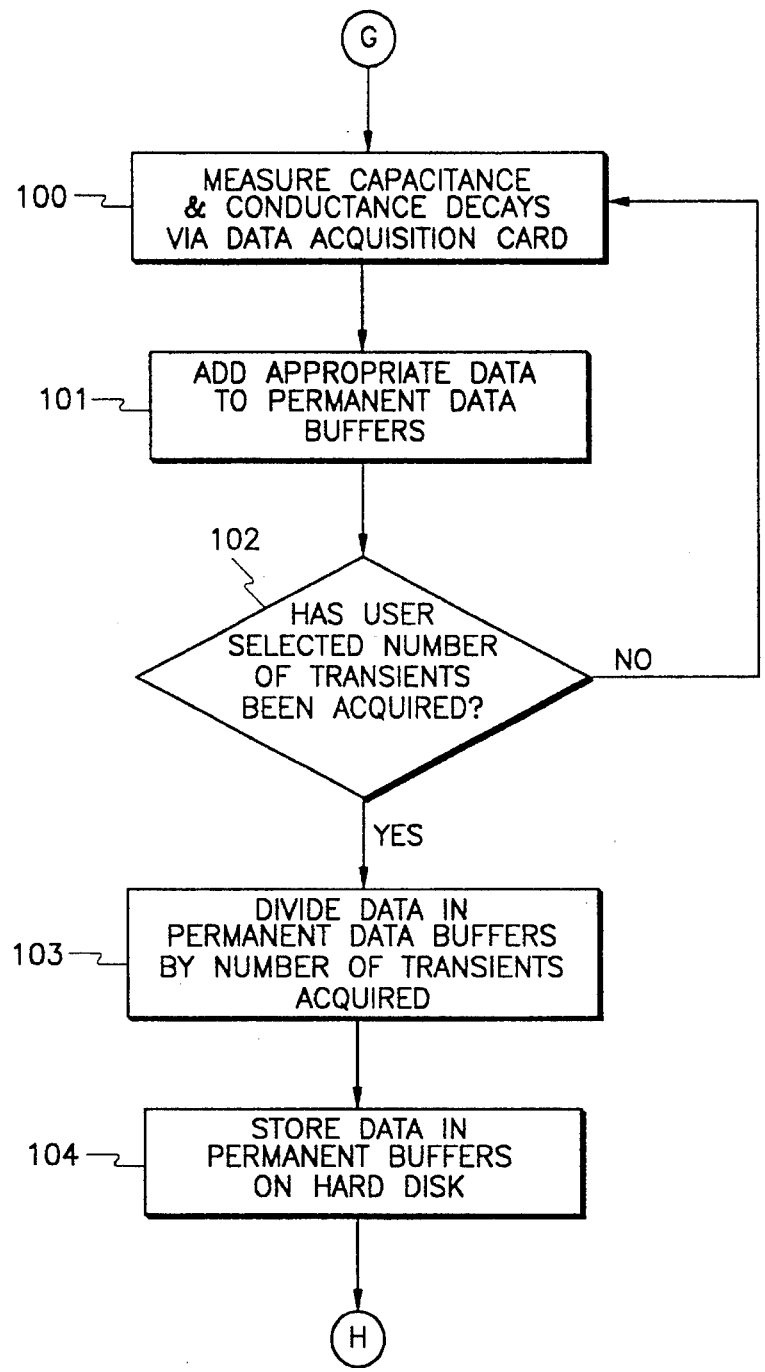

The system program 50 is preferably in conventional C language because the use of pointers is crucial in the present invention. Since DOS programs are limited to 640K bytes of memory and a substantial part of this memory is devoted to buffers allocated for temporarily storing the transients (256K bytes), the system program 50 is preferably designed to conserve memory, as is well known in the art. A flow chart for the system program 50 is shown in FIGS. 5A–5C, which program is described in further detail hereinafter. The system program 50 for the system 10 essentially comprises four primary sections: (A) measurement/hardware setup (flow chart block 51 of FIG. 5A), (B) memory allocation (flow chart blocks 52–64 of FIGS. 5A–5B), (C) acquisition control (flow chart blocks 65–107 of FIGS. 5A–5I), and (D) post measurement analysis (either transient or conventional; flow chart block 108 of FIG. 5I).

B. Measurement/Hardware Setup

The measurement and hardware setup routine is indicated in flow chart block 51 of FIG. 5A. This routine is a menu driven routine that selects the parameters that are to be implemented. The GPIB bus 27 is used to setup the instruments with the selected parameters. Some of the many parameters, particularly those related to the timing, allow the user to trade off measurement time for the number of subsets to be analyzed. Important measurement/hardware parameters include the channels (capacitance and/or conductance) to sample, the base acquisition rate, system gain, the base buffer size, and the subset size. Additional hardware/measurement options that can be selected are possible and can include, for instance, the degree of reverse bias, the filling pulse voltage and width, starting and ending temperatures, temperature increment, capacitance test signal level (for instance, 15, 30, 50 or 100 mV), the number of averages at each temperature, and the delay time defined as the time period after the end of the filling pulse before data acquisition begins.

The base acquisition rate is defined as f=4 MHz/N, where N is an integer greater than 25. If both the capacitance and conductance are sampled simultaneously, the actual sample rate for each transient is half of the base acquisition rate. The base acquisition rate can be chosen up to 150 kHz and is adjusted to the closest allowable frequency available on the DT2821-F digitizing mechanism 14.

Total system gains of 5, 10, 20 or 40 can be selected from the menu. These high gains when combined with signal averaging can significantly increase the resolution in terms of trap concentration.

The measurement time can be controlled by adjusting the base acquisition rate or the base buffer size. By choosing a base buffer size less than the nominal value of 131,072, the measurement time can be decreased at the expense of the total number of rates stored for each transient.

C. Memory Allocation

Certain blocks of memory must be allocated for use with the DT2821-F digitizing mechanism 14. These blocks will hold the data samples converted by the DT2821-F digitizing mechanism 14 and thus cannot be used by the system program 50 while data acquisition is taking place. However, unlike the case when the transients are converted by a remote digitizer, the data is available for program use directly after the DT2821-F digitizing mechanism 14 finishes sampling. The memory allocation process of the preferred embodiment is set forth in flow chart blocks 52 through 64.

Essentially, four data buffers are dynamically allocated. A base buffer, mentioned above, contains the actual transient data points of interest. The base buffer is generated in flow chart blocks 52–55 of FIG. 5A. The buffer length is selected in the measurement/hardware setup routine which limits the buffer length to a power of 2 and is less than or equal to 131,072 data points. This requires up to 256K bytes of memory, and because the DT2821-F digitizing mechanism 14 cannot transfer data across a physical 128K memory page, the base buffer must be broken up into smaller buffers that straddle the memory page boundaries, as indicated in flow chart blocks 53–55. Each smaller buffer is then added to the DT2821-F buffer transfer list and are filled sequentially.

A larger base buffer size is possible if the buffers are allocated in expanded memory, but this configuration requires a DMA transfer to lower memory in order for the program to access the data. Because this bottlenecks the data acquisition in the same way that a remote digitizer would, this configuration is undesirable.

Another integer buffer, called a pulse buffer, is also generated with an appropriate length to contain the data points retrieved during the entire pulse and delay time. Creation of the pulse buffer occurs at flow chart blocks 56–61 of FIG. 5A. The length of the pulse buffer is given by, Buffer Size 1=Adjusted Rate×(1.06×Pulsed Time+Delay Time)  (3)

where the factor of 1.06 is included to insure that even if the pulse width is longer than the maximum inaccuracy of the HP8112A pulse generator 18 (5%), the pulse buffer is long enough to hold the entire pulse, hence allowing the pulse width to be measured. The buffer is then allocated and the pulse is sampled in order to accurately measure its width. The exact pulse width is then determined by finding the maximum negative derivative of the sampled pulse. This corrected pulse time is then used in equation 3, but with the 1.06 factor replaced by 1.0, to reallocate the first buffer to the correct size. The data sampled into this buffer is not stored and is only used for timing purposes.

As with the base buffer, the pulse buffer must be broken up into smaller buffers that straddle the memory page boundaries, as indicated in flow chart blocks 59–61. Each smaller buffer is then filled sequentially.

A permanent data buffer is also generated for averaging the capacitance/conductance transients. The permanent data buffer is a floating point buffer which is created in flow chart block 62. By using floating point arithmetic averaging, the "effective" resolution is enhanced beyond the 12 bit digitization of the ADC of the digitizing mechanism 14. As mentioned before, in order to use floating point averaging in conjunction with a remote digitizer, each transient must be downloaded from the digitizer, thereby undesirably requiring an enormous amount of time.

A pointer buffer is also generated, as indicated in flow chart blocks 63, 64. In the pointer buffer is placed an array of pointers which reference the desired memory locations within the base buffer so that the system program 50 need not loop through the entire base buffer. In this way, the averaging is done only over the points to be extracted, greatly increasing the speed of the averaging process. When sampling only the capacitance or only the conductance, if L is the number of points in the subset (128 in the above example), then the first L points in the pointer array "point" to the first L points in the base buffer. The next L/2 points in the pointer array "point" to L/2 points occurring every other point in the base buffer starting at the $L+1^{th}$ point, and so on. When both capacitance and conductance is to be sampled at the same time, the pointer array is similar, except that it accounts for every other data point in the base buffer corresponding to a conductance value, the intermittent points being capacitance values. The two transients are separated into and may be averaged in different arrays.

D. Acquisition Control

The acquisition control occurs in flow chart blocks 65–107 in FIGS. 5A–5I. First, in flow chart block 65, the pulse generator, capacitance/conductance sensor 12, and temperature controller 26 are setup with the user selected parameters chosen in the measurement/hardware input routines (flow chart block 51) using the interface bus controller 28 and interface bus 27. The data acquisition card is programmed (buffer addresses and buffer lengths are written to the card, the sample rate is set, and the card is set to operate in dual DMA transfer mode) at flow chart block 66. If the current temperature is lower than the user chosen ending temperature, the temperature controller 26 is instructed to raise the temperature to above the ending temperature, as indicated in flow chart blocks 67 and 68. As indicated in flow chart block 69, the temperature controller 26 is then instructed to set the temperature to approximately 10 degrees below the starting temperature (selected in block 51). While the test material 13 is cooling, the temperature, capacitance, and conductance are measured using components 28, 27, 26, and 12 and stored in a file in memory, preferably the computer hard disk. The appropriate binary code is output by the computer 17 to the digitizing mechanism 14 which outputs the digital code to the differential capacitance/conductance mechanism 15. This differential capacitance/conductance mechanism 15 is a bank of capacitors and resistors which are connected via relays to the differential terminals of the capacitance/conductance sensor 12. Using the mechanism 15, the baseline capacitance of the test material/device is nullified. If the user input starting temperature is not yet reached, this process is repeated, as noted in flow chart blocks 70–72. The test material 13 is held at a temperature approximately 10 degrees below the starting temperature for a time period, preferably five minutes, to dampen any thermal oscillations in the cryostat 24 and to allow the autotuning temperature controller 26 to adjust its PID (proportional, integral, and differential) control parameters automatically. In this regard, see flow chart block 73.

If the pulse width is longer than the sample period (1/sample rate), then this width is measured and the temporary buffers used to store the pulse are adjusted to the appropriate lengths in flow chart blocks 74–78. The capacitance sensor 12 is then set to auto range (flow chart block 79) to insure that the first capacitance/conductance reading is valid, and a trigger pulse is applied, as indicated in flow chart block 81. The capacitance and conductance are measured as noted at flow chart block 82 using components 12, 27, and 28, and the baseline capacitance and conductance is offset using components 14, 15. The capacitance/conductance sensor 12 is set to the next most sensitive range as indicated at flow chart block 84, the pulse is applied as noted at block 85, capacitance and conductance is measured as indicated at block 86 using components 12, 27, 28, and the baseline values are then offset again using components 14, 15. The sensor 12 is then set to its most sensitive range (2 pF/2 µS) and the processes of blocks 85–87 are repeated (except that the capacitance and conductance values are read from the digitizing mechanism 14 instead of from components 12, 27 and 28) in blocks 89–93 until the values output to differential capacitance/conductance mechanism 15 remain unchanged between successive readings.

If the user choses a fixed gain, then the flow of the program passes to block 98. Otherwise, a pulse is applied (flow chart block 95) and the capacitance and/or conductance are measured over time via the digitizing mechanism 14, and the minimum and maximum values of the decay are determined as noted at block 96. The gain of the digitizing mechanism 14 is then set to the maximum allowable (<±10 volts) without clipping the signal. The permanent buffers are then zeroed, as indicated at block 98. The pulse is applied as noted at block 99. Next, as indicated at block 100, the capacitance and/or conductance decays are measured via the digitizing mechanism 14 and the appropriate data points in the base buffer (temporary buffer) are added to the permanent data buffer 101. The process from blocks 99 to 102 are repeated until the user selected number of transients to be acquired at each temperature have been added to the permanent data buffer 102. The data in the permanent data buffers are then divided by the number of transients acquired, as indicated at block 103 and this data is stored on the hard disk, as noted at block 104.

If this is not the last temperature, the temperature is incremented by the temperature controller 26 and the process in blocks 79–105 is repeated, as indicated in blocks 105, 106. However, if this is the last temperature, all meters, interfaces, and the digitizing mechanism 14 are released from program control.

E. Post Measurement Analysis

Figure 5I:
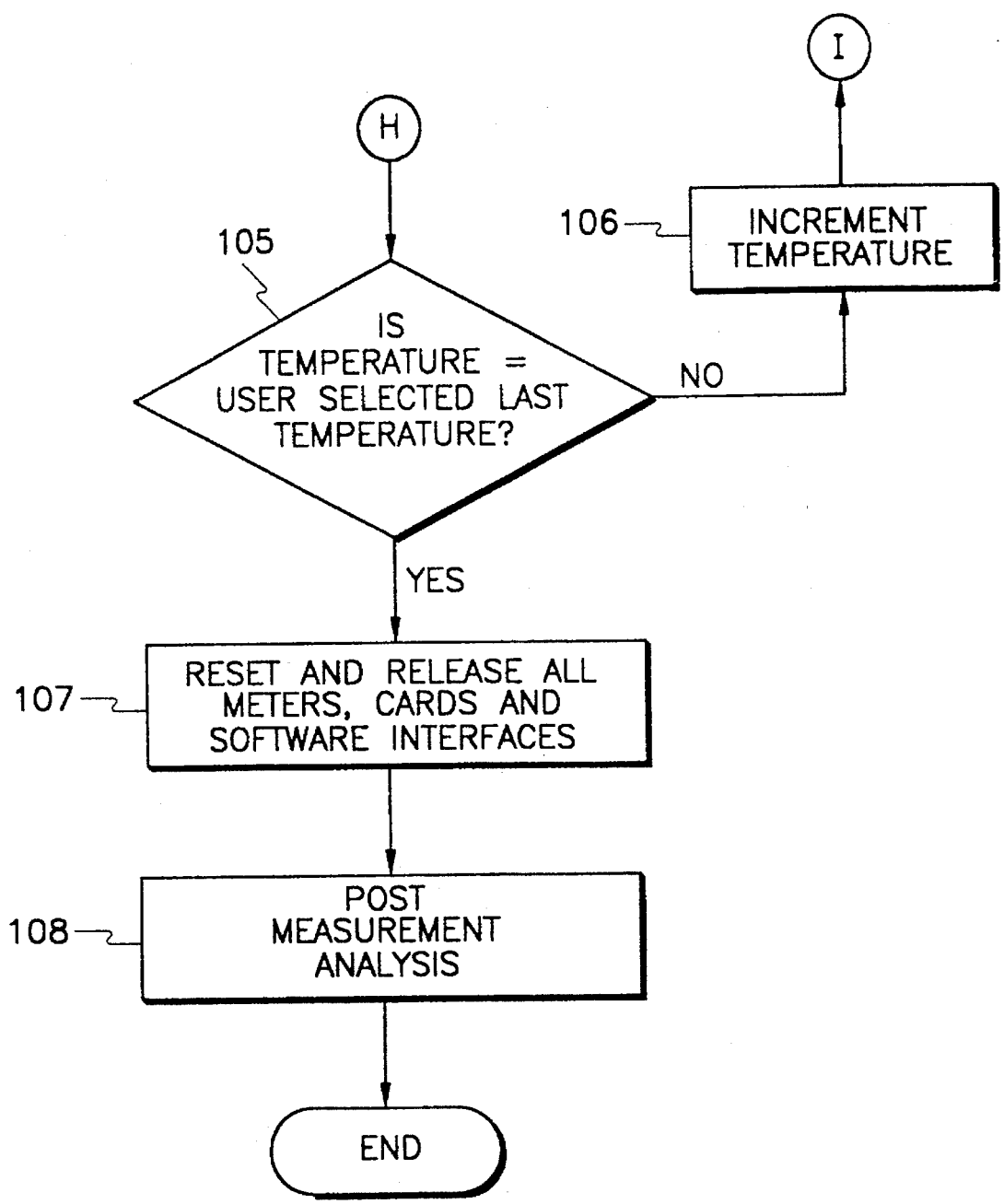

The post measurement analysis, occurring at flow chart block 108 in FIG. 5I, can be performed by the system program 50 using either conventional DLTS spectrum methods or conventional transient methods. Conventional DLTS support is preferably included to facilitate fast analysis when the more time consuming transient analysis is not required. As examples, the conventional DLTS methods which can be implemented include boxcar, rectangular ("lockin style"), and Miller correlator techniques. The methods of transient analysis which may be employed include, for instance, non-linear least squares fitting, modulation functions, and the correlation method of linear predictive modeling. It should be emphasized that many other analysis techniques, not mentioned above, could be employed to analyze the acquired data points corresponding to the capacitance and conductance transients.

1. Conductance Transients

All conventional capacitance/conductance sensors measure capacitance and conductance based on the assumption that the test material 13 is a parallel RC circuit 111, as shown in FIG. 6A, having a parallel capacitance $C_m$ and a parallel conductance $G_m$ (m=measured). However, an actual test material 13 has an additional series resistance $R_a$ (a=actual) associated with it as illustrated in the series RC circuit 113 of FIG. 6C. In cases where the actual series resistance $R_a$ associated with the test material 13 is much larger than the inverse of the actual parallel conductance $G_a$, transformations can be made which convert the measured capacitance $C_m$ and measured conductance $G_m$ to an equivalent series RC circuit 112, as shown in FIG. 6B, having equivalent series capacitance $C_s$ (s=series) and equivalent series resistance $R_s$. The equations that define the foregoing transformation are as follows:

$$C_{series} = \frac{G_m^2 + (\omega C_m)^2}{C_m \omega^2} \qquad (4)$$

and $$R_{series} = \frac{G_m}{G_m^2 + (\omega C_m)^2} \qquad (5)$$

It has been suggested that conductance transients can be used to perform DLTS using conventional lockin amplifier techniques. See N. Fourches, Appl. Phys. Lett., 58, 364 (1991). However, such techniques are limited to fairly low energy resolution and have application only in high resistivity test materials 13, where the series resistance $R_s$ dominates the overall impedance.

Figure 7A:
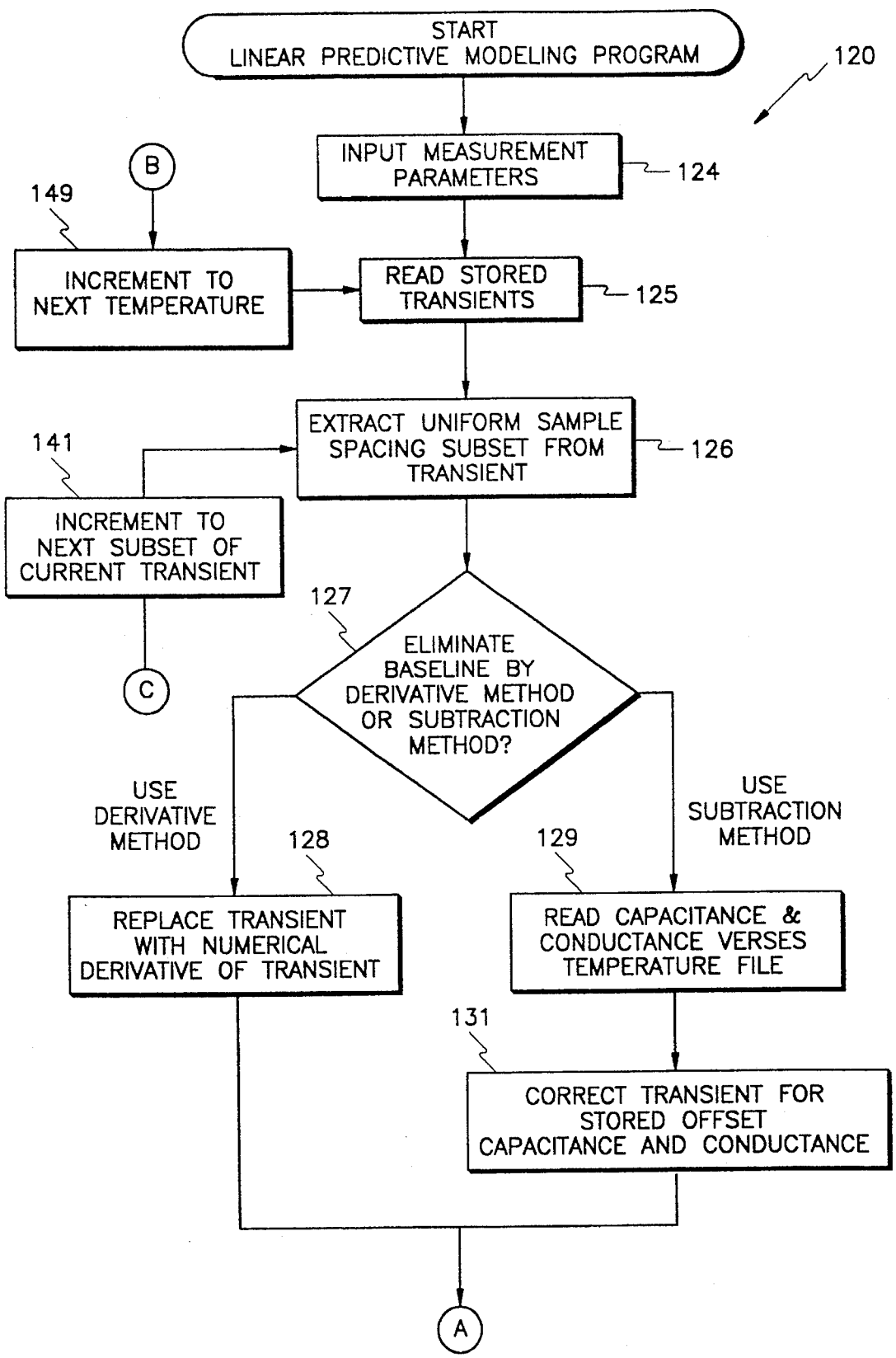
FIGS. 7A and 7C show a flow chart for a novel covariance method of linear predictive modeling which may optionally be utilized in the system program of FIGS. 5A through 5C.
Figure 7B:
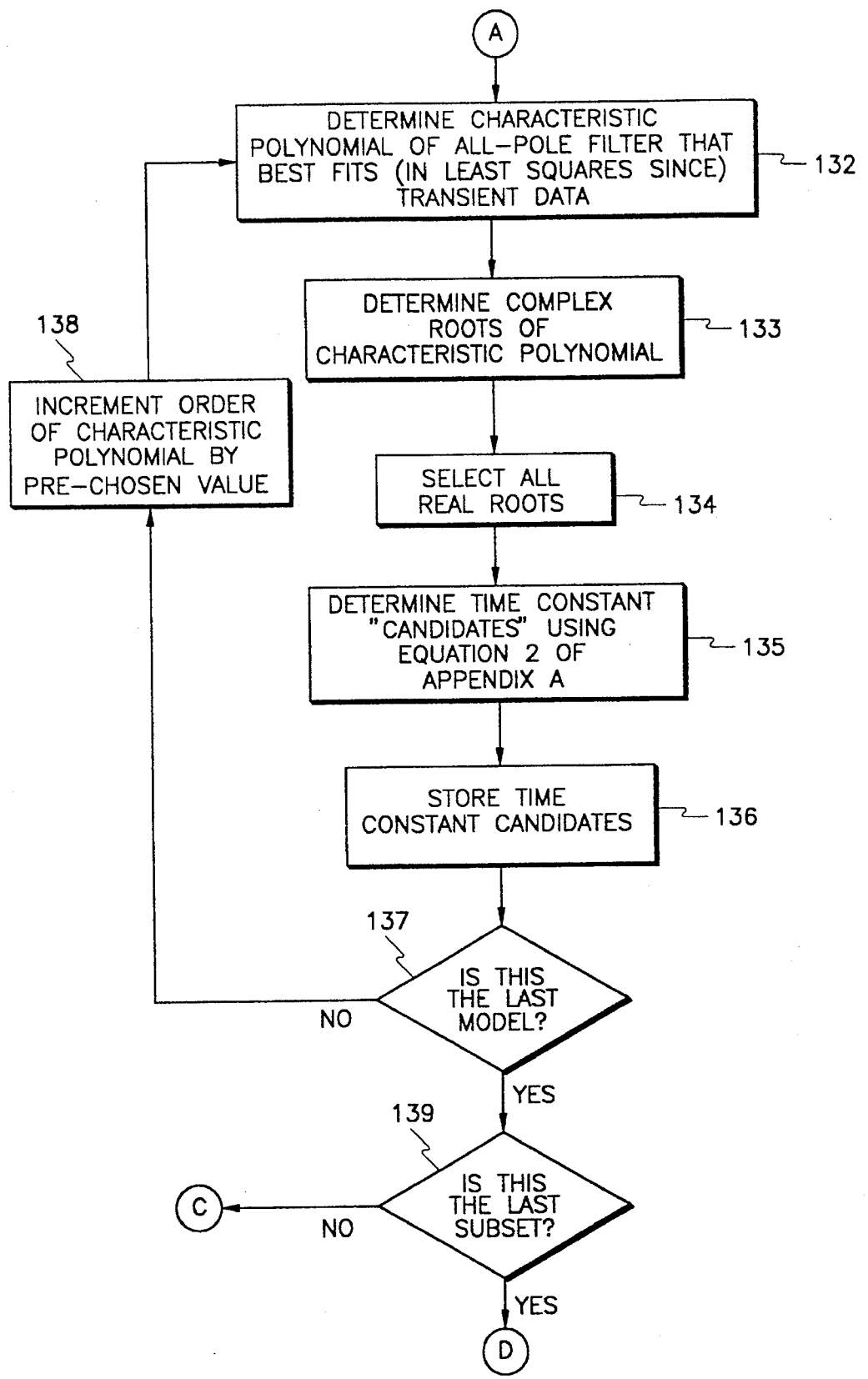

In order to circumvent the energy resolution limitations, the conductance transient is directly analyzed in the present invention. Although a form of linear predictive modeling approach is used to achieve this end, any transient analysis routine can be used that extracts the transient time constants τ (and optionally their component magnitudes). A novel linear predictive modeling program (i.e., covariance method) of the present invention is shown in FIGS. 7A and 7B, and will be described in further detail later herein.

The parallel RC circuit 111 of FIG. 6A is valid for test materials 13 with negligible actual series resistance $R_a$. The series RC circuit 112 of FIG. 6B is valid for circuits where both the series resistance $R_{actual}$ is much larger than the parallel resistance $(1/G_{actual})$ and the parallel capacitive impedance $\omega C_{actual}$ is much larger than the parallel resistance $(1/G_{actual})$. However, neither equivalent circuit 111, 112 is satisfactory in the intermediate region between the two extremes, i.e., when $R_{actual} \sim (1/G_{actual})$ or $R_{actual} \sim \omega C_{actual}$.

In the present invention, a method may be employed during the post measurement analysis step, indicated at flow chart block 108 in FIG. 5I, which corrects for the effects of the series resistance $R_a$ in test materials 13 where the three impedances $\omega C_a$, $1/G_a$, and $R_a$ are comparable. This method relates the measured capacitance $C_m$ and conductance $G_m$ (FIG. 6A) and a measured device bias current (very low frequencies <20 kHz) to the actual parallel capacitance $C_a$, actual parallel conductance $G_a$, and actual series resistance $R_a$ (FIG. 6C). To form these relations, the following equations are utilized:

$$\frac{G_m}{G_m^2 + (\omega C_m)^2} = \frac{G_a + R_a(G_a^2 + (\omega C_a)^2)}{G_a^2 + (\omega C_a)^2} \qquad (6)$$

and, $$\frac{C_m}{G_m^2 + (\omega C_m)^2} = \frac{C_a}{G_a^2 + (\omega C_a)^2} \qquad (7)$$

as well as the following additional equation which is obtained from a low frequency impedance (measured current at a known or measured bias) measurement:

$$R_a + \frac{1}{G_a} = Z_o = \frac{V_{bias}}{I_{measured}} \quad (8)$$

where $Z_o$ is the measured low frequency device impedance. The impedance $Z_o$ is obtained by measuring the leakage current of the test material 13 at the known quiescent reverse bias (as a function of time after the filling pulse is applied). In this way, equations (6)–(8) can be iteratively solved to calculate the parameters $C_a$, $G_a$ and $R_a$. With this knowledge, the transient time constant τs can be determined based upon either the conventional spectrum analysis approach or the transient analysis approach using the transients of any of the three parameters $C_a$, $G_a$ and $R_a$. This procedure allows DLTS analysis to be performed using capacitance, conductance, and current simultaneously. Additionally, errors due to the incorrect RC model can be incorporated, making knowledge of trap concentrations and time constants much more accurate.

2. Covariance Method of Linear Predictive Modeling

Figure 7C:
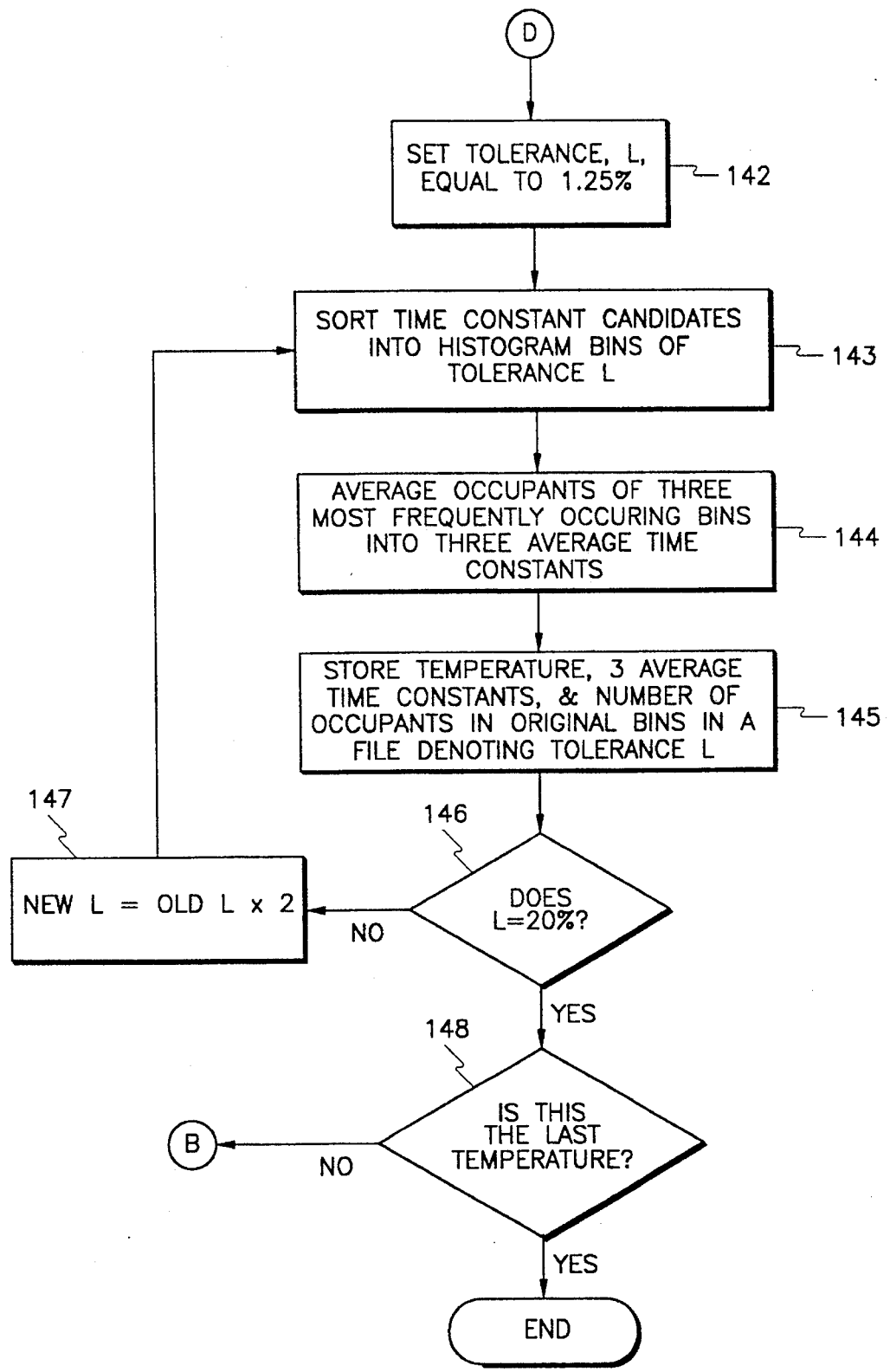

In order to provide high energy resolution for both capacitance and conductance calculations, the transients are directly analyzed in the present invention via a covariance method 120 of linear predictive modeling, which is implemented as indicated in flow chart blocks 124–148 of FIGS. 7A and 7C. The use of linear predictive modeling for determining the capacitance time constants τ in a digital DLTS measurement was first suggested in F. R. Shapiro, S. D. Senturia, and D. Adler, J. Appl. Phys. 55, 3453 (1984). The covariance method 120 of linear predictive modeling of the present invention is a modified version of the methodology presented by Shapiro et al. The modifications made to the Shapiro et al. technique by the present invention include the elimination of the baseline capacitance and/or conductance. This implementation eliminates excess noise introduced by the Shapiro et al. process.

The capacitance signal, in the presence of excess noise, of M individual electronically active traps is given in discrete time by, $$c[n] = C_o + \sum_{m=1}^{M} C_m r_m^n + \text{noise}[n] \quad (9)$$

where n is the discrete time variable ($0 \leq n \leq N-1$), $$r_m = \exp(-\Delta t / \tau_m) \quad (10)$$

and the noise is modeled as, $$\text{noise}[n] = \sum_{m=M+1}^{L} N_m s_m^n \quad (11)$$

with, $$s_m = \exp(-\Delta t / \sigma_m + j\omega_m) \quad (12)$$

The $\Delta t$ term is the sample spacing (required to be uniform), while the $C_m$ and $N_m$ terms are the capacitance and noise component magnitudes respectively, $\tau_m$ is the $m^{th}$ defect time constant, $C_o$ is the baseline capacitance, and $\sigma_m$ and $\omega_m$ characterize the noise present in the signal. Note that the noise term in equation (11) is only a model of the actual noise in the capacitance transient and would represent the actual noise in the capacitance transient only if we include an infinite number of "Laplacian" components (i.e. L→∞). The Z transform of equation (9) is, $$Z(c[n]) \frac{C_o}{1-z^{-1}} + \sum_{m=1}^{M} \frac{C_m}{1-r_m z^{-1}} + \sum_{m=M+1}^{L} \frac{N_m}{1-s_m z^{-1}} \quad (13)$$

We can write equation (13) as, $$Z(c[n]) = C(z^{-1}) = \frac{B(z^{-1})}{A(z^{-1})} = \quad (14)$$

$$\frac{B(z^{-1})}{\prod_{m=0}^{M}(1-r_m z^{-1}) \prod_{m=M+1}^{L+1}(1-s_m z^{-1})}$$

where $B(z^{-1})$ is a polynomial in $z^{-1}$ of order L whose coefficients involve sums of products of the $C_m$s, $N_m$s, $r_m$s and $s_m$s. Equation (14) defines an equivalent convolution in discrete time, i.e.

$$a[n] * c[n] = b[n] \quad (15)$$

where $a[n]$, $b[n]$ and $c[n]$ are the inverse z-transforms of $A(z^{-1})$, $B(z^{-1})$, and $C(z^{-1})$. Such a convolution defines restrictions on $a[n]$ and $b[n]^2$ such that $0 \leq n \leq L$, $$\sum_{m=0}^{n} a[m]c[n-m] = b[n] \quad (16)$$

while for n>L, $$\sum_{m=0}^{L+1} a[m]c[n-m] = 0(\text{noiseless case}) = NE(\text{noisy case}) \quad (17)$$

Only in the cases of no noise (L=M), or all the noise accounted for by the model (L→∞) will equation (17) be equal to 0. The right side of equation (17) will, in general, be a non-zero term we will refer to as the noise error (NE). The noise error results from the fact that to properly model the random noise, L should approach ∞. We have arbitrarily chosen L such that L>>M. This condition is, in practice, easily satisfied since M, the number of electrically active traps in the material, is usually very small.

The task of CMLPM is then to find the coefficients that define a particular $a[n]$ that results in a minimization of the NE in the least-squared-error sense. To achieve this end, we define a sum of the squared noise error for n>L, $$E = \sum_{n>L}^{N-1} \left[ \sum_{m=0}^{L+1} a[m]c[n-m] \right]^2 \quad (18)$$

Thus, $$\frac{\partial E}{\partial a_j} = 0 \quad (19)$$

$$= 2 \sum_{n>L}^{N-1} c[n-j] \sum_{m=0}^{L+1} a[m]c[n-m] \quad (20)$$

$$= 2 \sum_{m+o}^{L+1} a[m] \sum_{n>L}^{N-1} c[n-j]c[n-m] \quad (21)$$

for $1 \leq j \leq L\_1$.

This (L+1)×(L+1) matrix can be solved, and results in the coefficients of $A(z^{-1})$. The power of CMLPM then is seen by noticing that the roots of $A(z^{-1})$, $r_m$'s, $s_m$'s, are related to the time constants τ of the electrically active traps and the "model" of the noise via equations (10) and (12). We are interested in only the real roots, $r_m$'s, which result from carrier emission from traps. To extract only the trap related real time constants ($\tau_m$'s from $r_m$'s and equation (10)) verses the noise related time constants ($\sigma_m + j\omega_m$)'s from $s_m$'s, and equation 4 where $\omega_m$ can equal zero) one chooses several different values of L and records only the real roots of $A(z^{-1})$ obtained by the above procedure in a histogram file.

The time constants τ recorded in this histogram file are sorted into bins of preset tolerances (1.25, 2.5, 5.0, 10.0, and 20%). For each temperature, all values in the most full bin are averaged to a single value (along with a statistical uncertainty), which is plotted in an Arrhenius plot. All values in this bin are then tagged so that they do not contribute to any other bin. The next fullest bin is then averaged and plotted as before. These values are also tagged and the procedure is again performed for one final bin. For each of the above tolerances, separate Arrhenius plots are obtained, which can be compared for consistent linear data. If more than one time constant τ exist in the transient within the resolution of the technique, this is reflected by multiple linear data regions in the Arrhenius plots. If only one time constant τ exists, the Arrhenius plot only has one linear region of data. Hence, unlike other transient analysis techniques, prior knowledge of the number of transient components is not needed.

The modifications made to this technique by the present invention include the elimination of the baseline capacitance and/or conductance via subtraction of previously measured capacitance and/or conductance values. This implementation eliminates the excess noise that is introduced by the derivative process used by Shapiro et al. to eliminate the baseline capacitance.

It will be obvious to those skilled in the art that many variations and modifications may be made to the above-described preferred embodiment without substantially departing from the spirit and scope of the present invention. Accordingly, all such variations and modifications are intended to be included herein within the scope of the present invention, as set forth in the following claims.

Wherefore, the following is claimed:

1. A system for performing deep level transient spectroscopy (DLTS) analysis on a material, said DLTS analysis including analysis of an impedance of the material, said impedance including a series resistance, a parallel conductance and a parallel capacitance, said system comprising:

means for applying a pulse to said material;

means for measuring signals responsive to said pulse and representing the impedance of the material versus time;

means for accurately determining an activation energy level for a trap in said material from a parallel conductance sequence of data points, the trap being a disruption in normal crystalline periodicity of said material caused by an impurity or defect that is capable of trapping charge carriers in said material so that a trapped charge carrier must acquire the activation energy to be freed from the trap.

2. The system of claim 1, further comprising a means for determining a capture cross section associated with said trap, said capture cross section indicating a probability that a free charge carrier will be trapped in said trap.

3. The method of claim 1, further comprising a means for determining a density of traps in said material.

4. The system of claim 1, further comprising:

means for generating a parallel capacitance sequence of data points representative of a parallel capacitance transient of said material, and for generating a series resistance sequence of data points representative of a series resistance transient of said material concurrently with said parallel conductance sequence; and means for accurately determining said activation energy level for said trap in said material by the combination of said parallel capacitance sequence and said parallel conductance sequence.

5. The system of claim 4, further comprising:

means for measuring the parallel capacitance of said material versus time and for generating said parallel capacitance sequence of data points, each representative of a parallel capacitance of said material at a corresponding time.

6. The system of claim 4, further comprising:

means for generating a series resistance sequence of data points representative of a series resistance transient of said material concurrently with said parallel conductance sequence; and means for accurately determining includes means for accurately determining said activation energy level for such trap in said material by the combination of said series resistance sequence, said parallel capacitance sequence and said parallel conductance sequence.

7. The system of claim 1, further comprising a means for digitizing said transient prior to determining said activation energy level for said trap.

8. The system of claim 1, further comprising:

means for measuring the parallel conductance of said material versus time and for generating said parallel conductance sequence of said material at a corresponding time.

9. The system of claim 1, further comprising:

means for generating a series resistance sequence of data points representative of a series resistance transient of said material concurrently with said parallel conductance sequence; and means for accurately determining said activation energy level for such trap in said material by the combination of said series resistance sequence and said parallel conductance sequence.

10. A system for accurately determining time constants associated with traps in a material over a broad range of temperatures by using data compression, the traps being disruptions in normal crystalline periodicity of said material caused by impurities or defects that are capable of trapping charge carriers in said material so that said trapped charge carriers must acquire activation energies to be freed from the traps, said system comprising:

means for applying a pulse to the material;

means for measuring signals responsive to said pulse and representing the capacitance of the material versus time and for generating a sequence of n data points, each representative of a capacitance of said material at a corresponding time;

means for selecting a plurality of subsets of data points from said sequence, each of said subsets comprising data points spaced every $x^n$th in said sequence, where x and n are each positive numbers greater than 1, where x is a constant, and where n uniquely designates each of said subsets; and means for utilizing said subsets to determine respective time constants.

11. The system of claim 10, wherein x=2.

12. The system of claim 10, further comprising a means for determining an activation energy level associated with a trap by utilizing said subsets.

13. The system of claim 10, further comprising a means for determining a capture cross section associated with a trap by utilizing said subsets, said capture cross section indicating a probability that a free charge carrier will be trapped in said trap.

14. The system of claim 10, further comprising a means for determining a density of traps in said material by utilizing said subsets.

15. A system for performing deep level transient spectroscopy (DLTS) analysis on a material, said DLTS analysis including analysis of an impedance of the material, said impedance including a series resistance, a parallel conductance and a parallel capacitance, said system comprising:

means for applying a pulse to said material;

means for measuring signals responsive to said pulse as a sequence of data points for at least one of the series resistance, the parallel conductance and the parallel capacitance of the material as a function of time, the material including traps that are disruptions in normal crystalline periodicity of said material that are capable of trapping charge carriers in said material so that a trapped charged carrier must acquire an activation energy to be freed from the trap;

means for selecting a subset of the sequence of data points, said subset including data points that are equally spaced in time; and means for determining at least one activation energy level of a trap in the material based upon said subset.

16. The system of claim 15, wherein said subset includes a distinct logarithmic progression of data points.

17. The system of claim 15, wherein a plurality of said subsets of data points are selected, each said subset being a distinct logarithmic sequences of data points.

18. The system of claim 15, wherein each said subset is defined by a different sampling rate.

19. The system of claim 18, wherein said sampling rates are logarithmically spaced so that said data points of said subsets are pseudo-logarithmically spaced.

* * * * *

UNITED STATES PATENT AND TRADEMARK OFFICE
CERTIFICATE OF CORRECTION

PATENT NO. : 5,521,839          Page 1 of 2
DATED : May 28, 1996
INVENTOR(S) : Doolittle et al.

DEEP LEVEL TRANSIENT SPECTROSCOPY (DLTS)

It is certified that error appears in the above-indentified patent and that said Letters Patent is hereby corrected as shown below:

Column 17, line 38, after "time;" add --and--.

Column 5, line 22, delete first occurance of "than" and replace with --then--.

Column 10, line 36, delete "Fig. 5A" and replace with --Figs. 5A 5B--.

Column 13, line 21, change "choses" to --chooses--.

Column 7, line 4, delete the second occurance of "by".

Column 3, line 59, delete "5C" and replace with --5I--.

Column 10, line 32, delete "5C" and replace with --5I--.

Column 9, line 36, delete "CdS$^{28}$" and replace with --CdS--.

UNITED STATES PATENT AND TRADEMARK OFFICE
CERTIFICATE OF CORRECTION

PATENT NO. : 5,521,839
DATED : May 28, 1996
INVENTOR(S) : Doolittle et al.
DEEP LEVEL TRANSIENT SPECTROSCOPY (DLTS)..

It is certified that error appears in the above-indentified patent and that said Letters Patent is hereby corrected as shown below:

Column 9, lines 36-37, delete "(the superscripts here refer to references in the paper I wrote not atomic numbers)".

Column 9, line 37, delete --"$Ge^{26}$" and replace with --Ge--.

Column 9, line 38, delete "(same here)".

Signed and Sealed this

Twenty-seventh Day of August, 1996

Attest:

BRUCE LEHMAN

*Attesting Officer*  *Commissioner of Patents and Trademarks*